United States Patent [19]

Moskowitz et al.

[11] Patent Number: 5,249,220
[45] Date of Patent: Sep. 28, 1993

[54] HANDHELD FACSIMILE AND ALPHANUMERIC MESSAGE TRANSCEIVER OPERATING OVER TELEPHONE OR WIRELESS NETWORKS

[75] Inventors: Jay Moskowitz, Hicksville; Abraham Karron, Long Beach; Peter Squillante, Central Islip; Spencer Kravitz, Hicksville, all of N.Y.

[73] Assignee: RTS Electronics, Inc., Hicksville, N.Y.

[21] Appl. No.: 687,380

[22] Filed: Apr. 18, 1991

[51] Int. Cl.$^5$ .................. H04M 11/00; H03M 7/40; H04L 27/10

[52] U.S. Cl. ........................ 379/93; 379/96; 379/97; 379/100; 341/106; 341/65; 341/67; 375/56

[58] Field of Search ............ 379/100, 93, 96, 97, 379/98, 52; 358/470, 427, 261.4; 341/106, 65, 90, 67; 178/18; 375/67, 56

[56] References Cited

U.S. PATENT DOCUMENTS

| | | | |
|---|---|---|---|
| 4,394,649 | 7/1983 | Suchoff et al. | |
| 4,440,977 | 4/1984 | Pao et al. | 379/97 |
| 4,514,825 | 4/1985 | Nordling | 379/98 |
| 4,620,294 | 10/1986 | Leung et al. | 379/98 |
| 4,794,634 | 12/1988 | Torihata et al. | 178/18 |
| 4,799,254 | 1/1989 | Dayton et al. | 379/97 |
| 4,805,208 | 2/1989 | Schwartz | 379/93 |
| 4,809,081 | 2/1989 | Linehan | 341/51 |
| 4,837,812 | 6/1989 | Takahashi et al. | 379/100 |
| 4,918,723 | 4/1990 | Iggulden et al. | |
| 5,055,841 | 10/1991 | Cordell | 341/67 |

*Primary Examiner*—James L. Dwyer
*Assistant Examiner*—Jason Chan
*Attorney, Agent, or Firm*—Brumbaugh, Graves, Donohue & Raymond

[57] ABSTRACT

According to the present invention, a hand-held portable transmitter is provided which is capable of communicating with a variety of different message receiving hosts. The transmitter is provided with a technique for generating waveforms to communicate with foreign message receivers over a communication channel by using a lookup table and software implementation in combination with a telephone interface circuit. Also provided is a versatile encoding protocol in which a message is optionally converted to a four-bit, five-bit, or six-bit sequence, or to a sequence of variable-length bit-strings, the converted message is queued and regrouped as four-bit nibbles, and the nibbles are communicated by DTMF tones.

58 Claims, 25 Drawing Sheets

FIVE BIT ENCODING

| BINARY CODE | HEX | GROUP 1 UC / LC | | GROUP 2 UC / LC | |
|---|---|---|---|---|---|
| 0 0000 | 0 | A | a | 0 | ' |
| 0 0001 | 1 | B | b | 1 | ; |
| 0 0010 | 2 | C | c | 2 | < |
| 0 0011 | 3 | D | d | 3 | > |
| 0 0100 | 4 | E | e | 4 | [ |
| 0 0101 | 5 | F | f | 5 | \ |
| 0 0110 | 6 | G | g | 6 | ] |
| 0 0111 | 7 | H | h | 7 | ^ |
| 0 1000 | 8 | I | i | 8 | _ |
| 0 1001 | 9 | J | j | 9 | ` |
| 0 1010 | A | K | k | : | { |
| 0 1011 | B | L | l | = | \| |
| 0 1100 | C | M | m | ? | } |
| 0 1101 | D | N | n | ! | ~ |
| 0 1110 | E | O | o | " | RESERVED |
| 0 1111 | F | P | p | # | RESERVED |
| 1 0000 | 10 | Q | q | $ | RESERVED |
| 1 0001 | 11 | R | r | % | RESERVED |
| 1 0010 | 12 | S | s | & | RESERVED |
| 1 0011 | 13 | T | t | ( | RESERVED |
| 1 0100 | 14 | U | u | ) | RESERVED |
| 1 0101 | 15 | V | v | * | RESERVED |
| 1 0110 | 16 | W | w | + | RESERVED |
| 1 0111 | 17 | X | x | - | RESERVED |
| 1 1000 | 18 | Y | y | / | RESERVED |
| 1 1001 | 19 | Z | z | @ | RESERVED |
| 1 1010 | 1A | ........ SPACE " " ............ | | | |
| 1 1011 | 1B | ........ COMMA "," ............ | | | |
| 1 1100 | 1C | ........ PERIOD "." ............ | | | |
| 1 1101 | 1D | ... SWITCH TO OTHER GROUP ............ | | | |
| 1 1110 | 1E | .SWITCH CASE WITHIN THIS GROUP ........ | | | |
| 1 1111 | 1F | EOT (END OF TRANSMISSION CHARACTER) | | | |

FIG. 7

SIX BIT ENCODING

| BINARY CODE | HEX | GROUP 1 UC / LC | | GROUP 2 UC / LC | |
|---|---|---|---|---|---|
| 00 0000 | 0 | <SPACE> | <SPACE> | [ | [ |
| 00 0001 | 1 | ! | ! | \ | \ |
| 00 0010 | 2 | " | " | ] | ] |
| 00 0011 | 3 | # | # | ^ | ^ |
| 00 0100 | 4 | $ | $ | _ | _ |
| 00 0101 | 5 | % | % | { | { |
| 00 0110 | 6 | & | & | \| | \| |
| 00 0111 | 7 | ' | ' | } | } |
| 00 1000 | 8 | ( | ( | ~ | ~ |
| 00 1001 | 9 | ) | ) | | |
| 00 1010 | A | * | * | | |
| 00 1011 | B | + | + | < ALL OTHER CODES ARE RESERVED IN GROUP 2 > | |
| 00 1100 | C | , | , | | |
| 00 1101 | D | - | - | | |
| 00 1110 | E | . | . | | |
| 00 1111 | F | / | / | | |
| 01 0000 | 10 | 0 | 0 | | |
| 01 0001 | 11 | 1 | 1 | | |
| 01 0010 | 12 | 2 | 2 | | |
| 01 0011 | 13 | 3 | 3 | | |
| 01 0100 | 14 | 4 | 4 | | |
| 01 0101 | 15 | 5 | 5 | | |
| 01 0110 | 16 | 6 | 6 | | |
| 01 0111 | 17 | 7 | 7 | | |
| 01 1000 | 18 | 8 | 8 | | |
| 01 1001 | 19 | 9 | 9 | | |
| 01 1011 | 1A | : | : | | |
| 01 1010 | 1B | ; | ; | | |
| 01 1100 | 1C | < | < | | |
| 01 1101 | 1D | = | = | | |
| 01 1110 | 1E | > | > | | |
| 01 1111 | 1F | ? | ? | | |

FIG. 8(a)

SIX BIT ENCODING (CONT'D)

| BINARY CODE | HEX | GROUP 1 UC / LC | GROUP 2 UC / LC |
|---|---|---|---|
| 10 0000 | 20 | @ ` | |
| 10 0001 | 21 | A a | |
| 10 0010 | 22 | B b | |
| 10 0011 | 23 | C c | |
| 10 0100 | 24 | D d | |
| 10 0101 | 25 | E e | |
| 10 0110 | 26 | F f | |
| 10 0111 | 27 | G g | < THESE GROUP 2 |
| 10 1000 | 28 | H h | CODES ARE |
| 10 1001 | 29 | I i | RESERVED > |
| 10 1000 | 2A | J j | |
| 10 1011 | 2B | K k | |
| 10 1100 | 2C | L l | |
| 10 1101 | 2D | M m | |
| 10 1110 | 2E | N n | |
| 10 1111 | 2F | O o | |
| 11 0000 | 30 | P p | |
| 11 0001 | 31 | Q q | |
| 11 0010 | 32 | R r | |
| 11 0011 | 33 | S s | |
| 11 0100 | 34 | T t | |
| 11 0101 | 35 | U u | |
| 11 0110 | 36 | V v | |
| 11 0111 | 37 | W w | |
| 11 1000 | 38 | X x | |
| 11 1001 | 39 | Y y | |
| 11 1010 | 3A | Z z | |
| 11 1011 | 3B | ········ RESERVED ········ | |
| 11 1100 | 3C | ········ RESERVED ········ | |
| 11 1101 | 3D | ···· SWITCH TO OTHER GROUP ······· | |
| 11 1110 | 3E | ···· SWITCH TO OTHER CASE ······· | |
| 11 1111 | 3F | EOT (END OF TRANSMISSION) | |

FIG. 8(b)

HUFFMAN ENCODING TABLE—AMERICAN ENGLISH
TABLE ORDERED BY CHARACTER CODE IN ASCII

| CHARACTER | HUFFMAN CODE | | | | |
|---|---|---|---|---|---|
| CHANGE CASE | 1100 | 1001 | | | |
| \<SPACE\> | 111 | | | | |
| EOT | 0001 | 1 | | | {END OF TRANSMISSION} |
| ! | 0010 | 1010 | 01 | | |
| " | 1100 | 1000 | 1001 | 10 | |
| # | 0010 | 1000 | 00 | | |
| $ | 1100 | 1000 | 1001 | 00 | |
| % | 1100 | 1000 | 1001 | 0111 | 1 |
| & | 0010 | 1000 | 1111 | | |
| ' | 1100 | 1000 | 0 | | |
| ( | 0010 | 1000 | 1110 | | |
| ) | 1100 | 1000 | 1011 | 1 | |
| * | 1100 | 1000 | 1000 | | |
| + | 1100 | 1000 | 1001 | 0110 | 1 |
| , | 0010 | 1010 | 1 | | |
| - | 0010 | 0 | | | |
| . | 0100 | 00 | | | |
| / | 1100 | 1010 | | | |
| 0 | 1001 | 11 | | | |
| 1 | 1101 | 11 | | | |
| 2 | 1100 | 11 | | | |
| 3 | 0101 | 11 | | | |
| 4 | 0110 | 10 | | | |
| 5 | 0101 | 10 | | | |
| 6 | 0100 | 11 | | | |
| 7 | 0010 | 11 | | | |
| 8 | 1000 | 01 | | | |
| 9 | 0100 | 01 | | | |
| : | 1000 | 001 | | | |
| ; | 1100 | 1000 | 1001 | 11 | |
| \< | 1100 | 1000 | 1001 | 0100 | 1 |
| = | 1001 | 10 | | | |
| \> | 1100 | 1000 | 1001 | 0111 | 0 |
| ? | 0010 | 1000 | 10 | | |
| @ | 1100 | 1000 | 1001 | 0101 | |

FIG. 9(a)

| CHARACTER | HUFFMAN CODE |
|---|---|
| A | 0111 |
| B | 1000 111 |
| C | 0101 0 |
| D | 0110 11 |
| E | 1010 |
| F | 0001 01 |
| G | 0001 00 |
| H | 1100 01 |
| I | 1011 1 |
| J | 0010 1011 |
| K | 1000 000 |
| L | 0011 |
| M | 1101 10 |
| N | 1001 0 |
| O | 1101 0 |
| P | 1000 10 |
| Q | 0010 1000 110 |
| R | 1011 0 |
| S | 0110 0 |
| T | 0000 |
| U | 1100 00 |
| V | 1100 1011 |
| W | 1000 110 |
| X | 1100 1000 11 |
| Y | 0100 10 |
| Z | 0010 1010 00 |
| [ | 1100 1000 1010 |
| \ | 0010 1000 01 |
| ] | 1100 1000 1011 0 |
| ^ | 1100 1000 1001 0100 0110 |
| _ | 0010 1001 |
| ` | 1100 1000 1001 0110 0 |
| { | 1100 1000 1001 0100 0111 |
| \| | 1100 1000 1001 0100 010 |
| } | 1100 1000 1001 0100 001 |
| ~ | 1100 1000 1001 0100 000 |

FIG. 9(b)

HUFFMAN ENCODING TABLE-AMERICAN ENGLISH
TABLE ORDERED BY HUFFMAN CODE LENGTH

| CHARACTER | HUFFMAN CODE | |
|---|---|---|
| <SPACE> | 1 1 1 | |
| A | 0 1 1 1 | |
| E | 1 0 1 0 | |
| L | 0 0 1 1 | |
| T | 0 0 0 0 | |
| C | 0 1 0 1 0 | |
| I | 1 0 1 1 1 | |
| N | 1 0 0 1 0 | |
| O | 1 1 0 1 0 | (LETTER O) |
| R | 1 0 1 1 0 | |
| S | 0 1 1 0 0 | |
| - | 0 0 1 0 0 | (HYPHEN) |
| EOT | 0 0 0 1 1 | (END OF TRANSMISSION) |
| D | 0 1 1 0 1 1 | |
| F | 0 0 0 1 0 1 | |
| G | 0 0 0 1 0 0 | |
| H | 1 1 0 0 0 1 | |
| M | 1 1 0 1 1 0 | |
| P | 1 0 0 0 1 0 | |
| U | 1 1 0 0 0 0 | |
| Y | 0 1 0 0 1 0 | |
| 0 | 1 0 0 1 1 1 | (NUMBER 0) |
| 1 | 1 1 0 1 1 1 | |
| 2 | 1 1 0 0 1 1 | |
| 3 | 0 1 0 1 1 1 | |
| 4 | 0 1 1 0 1 0 | |
| 5 | 0 1 0 1 1 0 | |
| 6 | 0 1 0 0 1 1 | |
| 7 | 0 0 1 0 1 1 | |
| 8 | 1 0 0 0 0 1 | |
| 9 | 0 1 0 0 0 1 | |
| . | 0 1 0 0 0 0 | (PERIOD) |
| = | 1 0 0 1 1 0 | |
| B | 1 0 0 0 1 1 1 | |
| K | 1 0 0 0 0 0 0 | |
| W | 1 0 0 0 1 1 0 | |
| : | 1 0 0 0 0 0 1 | (COLON) |

FIG. 9(c)

| CHARACTER | HUFFMAN CODE | |
|---|---|---|
| J | 0010 1011 | |
| V | 1100 1011 | |
| CHANGE CASE | 1100 1001 | |
| / | 1100 1010 | (SLASH) |
| _ | 0010 1001 | (UNDERSCORE) |
| ' | 1100 1000 0 | (APOSTROPHE/ASCII 27 HEX) |
| , | 0010 1010 1 | (COMMA) |
| X | 1100 1000 11 | |
| Z | 0010 1010 00 | |
| ! | 0010 1010 01 | |
| ? | 0010 1000 10 | |
| \ | 0010 1000 01 | (BACK SLASH) |
| # | 0010 1000 00 | (POUND/NUMBER SIGN) |
| Q | 0010 1000 110 | |
| [ | 1100 1000 1010 | |
| * | 1100 1000 1000 | |
| & | 0010 1000 1111 | |
| ( | 0010 1000 1110 | |
| ) | 1100 1000 1011 1 | |
| ] | 1100 1000 1011 0 | |
| ; | 1100 1000 1001 11 | (SEMI-COLON) |
| " | 1100 1000 1001 10 | |
| $ | 1100 1000 1001 00 | |
| @ | 1100 1000 1001 0101 | |
| % | 1100 1000 1001 0111 1 | |
| > | 1100 1000 1001 0111 0 | |
| + | 1100 1000 1001 0110 1 | |
| ` | 1100 1000 1001 0110 0 | (ASCII 60 HEX) |
| < | 1100 1000 1001 0100 1 | |
| \| | 1100 1000 1001 0100 010 | (VERTICAL BAR) |
| } | 1100 1000 1001 0100 001 | |
| ~ | 1100 1000 1001 0100 000 | (TILDE) |
| { | 1100 1000 1001 0100 0111 | |
| ^ | 1100 1000 1001 0100 0110 | (UP ARROW) |

FIG. 9(d)

DTMF CONVERSION TABLE

| BINARY NIBBLE | DTMF DIGIT | HEX REPR. | HIGH FREQUENCY (HZ) | LOW FREQUENCY (HZ) |
|---|---|---|---|---|
| 0000 | 0 | 0 | 1336 | 941 |
| 0001 | 1 | 1 | 1209 | 697 |
| 0010 | 2 | 2 | 1336 | 697 |
| 0011 | 3 | 3 | 1477 | 697 |
| 0100 | 4 | 4 | 1209 | 770 |
| 0101 | 5 | 5 | 1336 | 770 |
| 0110 | 6 | 6 | 1477 | 770 |
| 0111 | 7 | 7 | 1209 | 852 |
| 1000 | 8 | 8 | 1336 | 852 |
| 1001 | 9 | 9 | 1477 | 852 |
| 1010 | A | A | 1633 | 697 |
| 1011 | B | B | 1633 | 770 |
| 1100 | C | C | 1633 | 852 |
| 1101 | D | D | 1633 | 941 |
| 1110 | * | E | 1209 | 941 |
| 1111 | # | F | 1477 | 941 |

| INDEX (ENCODED VALUE) | PRIMARY GROUP UPPER CASE CHARS | PRIMARY GROUP LOWER CASE CHARS | SECONDARY GROUP UPPER CASE CHARS | SECONDARY GROUP LOWER CASE CHARS | |
|---|---|---|---|---|---|
| 0 | 0 | N/A | N/A | N/A | 4 BIT ENCODING |
| 1 | 1 | | | | |
| 2 | 2 | | | | |
| (HEX) ⋮ | ⋮ | | | | |
| A | ( | | | | |
| B | ) | | | | |
| C | SPACE | | | | |
| D | – | | | | |
| E | . | | | | |
| F | EOT | | | | |
| 0 | A | a | 0 | ' | 5 BIT ENCODING |
| 1 | B | b | 1 | ; | |
| 2 | C | c | 2 | < | |
| (HEX) ⋮ | | | | | |
| 1D | SWITCH TO OTHER GROUP | SWITCH TO OTHER GROUP | SWITCH TO OTHER GROUP | SWITCH TO OTHER GROUP | |
| 1E | SWITCH CASE | SWITCH CASE | SWITCH CASE | SWITCH CASE | |
| 1F | EOT | EOT | EOT | EOT | |
| 0 | SPACE | SPACE | [ | [ | 6 BIT ENCODING |
| 1 | ! | ! | \ | \ | |
| 2 | " | " | ] | ] | |
| (HEX) ⋮ | | | | | |
| 3D | SWITCH GROUP | SWITCH GROUP | SWITCH GROUP | SWITCH GROUP | |
| 3E | SWITCH CASE | SWITCH CASE | SWITCH CASE | SWITCH CASE | |
| 3F | EOT | EOT | EOT | EOT | |
| (BINARY) 10 | SPACE | SPACE | N/A | N/A | VARIABLE LENGTH ENCODING |
| 00 | 0 | | | | |
| 110 | 1 | | | | |
| | EOT | | | | |
| 01010 | . | | | | |
| 01001 | – | | | | |
| 01000 | 2 | | | | |
| 111111 | SWITCH CASE | | | | |

FIG. 17

TABULAR ENCODING SCHEME FOR
5 AND 6 BIT ENCODING OF
"B>A"
FIVE BIT ENCODING*
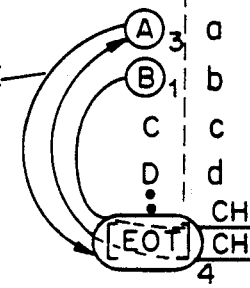
| BINARY ROW CODES | GROUP 1 UC \| LC | GROUP 2 UC \| LC |
|---|---|---|
| 00000 | A \| a | 0 \| ' |
| 00001 | B \| b | 1 \| ; |
| 00010 | C \| c | 2 \| < |
| 00011 | D \| d | 3 \| > |
| ⋮ | ⋮ | ⋮ |
| 11111 | EOT | EOT |
*ASSUME INITIAL GROUP TO BE GROUP 1 AND INITIAL CASE TO BE UPPER CASE FOR EACH GROUP.
SIX BIT ENCODING*
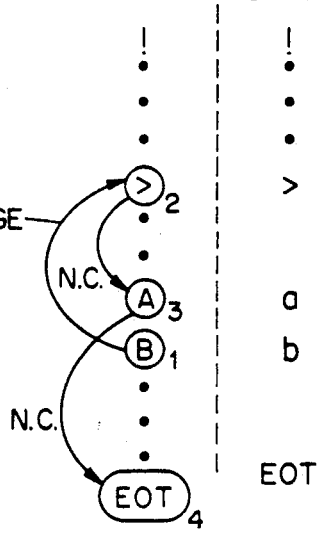
| BINARY ROW CODES | GROUP 1 UC \| LC | GROUP 2 UC \| LC |
|---|---|---|
| 000000 | <SPACE> \| <SPACE> | [ \| [ |
| 000001 | ! \| ! | / \| / |
| ⋮ | ⋮ | ⋮ |
| 011110 | > \| > | [RESERVED] |
| ⋮ | ⋮ | |
| 100001 | A \| a | |
| 100010 | B \| b | |
| ⋮ | ⋮ | |
| 111111 | EOT \| EOT | EOT \| EOT |
FIG. 19

DTMF REPRESENTATION OF ENCODING MODE USED BY TRANSMITTER

| HEX DIGIT | COMPRESSION TECHNIQUE |
|-----------|------------------------|
| 0 | 4 BIT ENCODING |
| 1 | 5 BIT ENCODING |
| 2 | 6 BIT ENCODING |
| 3 | HUFFMAN ENCODING – AMERICAN ENGLISH |
| 4 | RESERVED: HUFFMAN – BRITISH ENGLISH |
| 5 | RESERVED: HUFFMAN – FRENCH |
| 6 | RESERVED: HUFFMAN – SPANISH |
| 7 | RESERVED: HUFFMAN – GERMAN |
| 8 | RESERVED: HUFFMAN – ITALIAN |
| 9 | RESERVED: HUFFMAN – DUTCH |
| A | RESERVED: HUFFMAN – PORTUGUESE |
| B | RESERVED: HUFFMAN – BRAZILIAN |
| C | RESERVED: HUFFMAN – DANISH |
| D | RESERVED: HUFFMAN – SWEDISH |
| E | RESERVED: HUFFMAN – NORWEGIAN |
| F | RESERVED: EXTENDED CODE |

FIG. 24

5 BIT DECODING OF "CALL"

1. DTMF TONE RECEIVED BY MESSAGE RECEIVER → 1, 7, 8, 0, B, 5, F, C

2. BINARY EQUIVALENTS → 0001, 0111, 1000, 0000, 1011, 0101, 1111, 1100

3. REGROUP TO FIVE-BIT FROM LEFT TO RIGHT → 00010, 11110, 00000, 01011, 01011, 11111, 00

4. LOOK UP IN TABLE → C, CHANGE FROM UPPER TO LOWER CASE IN GROUP, a, l, l, [EOT]

FIG. 25

HANDHELD FACSIMILE AND ALPHANUMERIC MESSAGE TRANSCEIVER OPERATING OVER TELEPHONE OR WIRELESS NETWORKS

FIELD OF THE INVENTION

The present invention relates generally to a method and apparatus for transmitting data to data-receiving devices and, more particularly to a portable handheld facsimile transmitter capable of communicating with other message receiving hosts using different communication techniques to communicate alphanumeric messages.

BACKGROUND OF THE INVENTION

In recent years society has become increasingly dependent on the use of electronic data communication to deliver messages and information. As a result of this increased dependency, it has become increasingly important to have access to such media of communications wherever one may be.

One of the most popular media of electronic communication in recent years is the facsimile machine. These machines have now become commonplace in large and small businesses and in homes. The traditional facsimile machine has been a bulky nonportable machine that requires the user to prepare a paper document to be fed to the machine; the machine then scans and transmits the document to a similar machine.

Although mobile battery powered facsimile machines exist, these machines also tend to be bulky and cumbersome to transport. Rather than carry them around, most people tend to rely on the use of a fixed facsimile machine. When traveling, it is commonplace to have to pay to use a machine provided by a hotel or copy center.

Another area in which demand has grown in recent years is the paging industry. Pagers come in different models, some of which simply "beep", and others which display a specific number or message on a small screen. These pagers usually require a person seeking to activate another's pager to telephone a paging terminal and identify the pager to be activated. The paging terminal then sends out a radio frequency signal and activates the specified pager. With some pagers, the transmitted message can include alphanumeric messages. The person sending such a message is usually required to call up a service provider and to recite the message. The service provider keys in the message into a paging terminal which in turn delivers the desired message to the pager by radio signals.

There is thus a need for a portable handheld device for communicating alphanumeric messages to facsimile machines.

There is further a need to provide a portable handheld message transmitter capable of accessing paging terminals and communicating data required to direct a paging terminal to activate a desired pager and send a desired message thereto. There is also a need for a character transmission protocol for communicating alphanumeric character between a message transmitter and a data receiving host and to provide a transmitter capable of communicating such a protocol and a receiver for receiving such a protocol.

Finally, there is a need for a portable handheld message transmitter for communicating with a number of message receiving hosts having differing data communication types.

SUMMARY OF THE INVENTION

In accordance with the invention a portable message transmitter is provided which comprises an input means for receiving alphanumeric characters and commands from a user and for generating signals indicative thereof, a display means for displaying characters indicative of signals provided thereto, destination selection means for selecting a destination device, for establishing a transmission path in a switched network, and for determining an appropriate data type for the selected destination device. The transmitter further comprising message holding means responsive to signals generated by the input means for holding words of binary data indicative of a message from the user, each word associated with a particular character in the message; waveform synthesis means responsive to the data type being a first one of the at least two predetermined data types, for deriving pixel-map data indicative of rows of the perceived shape of the characters associated with the words of binary data, for producing bit streams indicative of the pixel-map data, and for synthesizing differential phase-shift key waveforms corresponding to the bit streams, whereby the waveforms may be received by a device recognizing said differential phase-shift key waveforms; waveform synthesis means further responsive to the said data type being a second one of the at least two predetermined data types, for deriving and queuing binary-coded signals associated with the words of binary data, for providing the signals in nibbles composed of fewer bits than the number of bits in the binary-coded signals, and for synthesizing dual-tone multifrequency waveforms indicative of the nibbles; and coupling means for coupling said synthesized waveforms to a transmission line.

In addition, a portable hand held message transmitter for use in selecting a destination device capable of receiving differential phase-shift key waveforms over a switched network is provided which comprises input means for receiving alphanumeric characters and commands from a user and for generating signals indicative thereof, display means for displaying characters indicative of signals provided thereto, destination selection means responsive to signals generated by the input means for selecting the destination device from among the plurality of destinations devices and for establishing a transmission path in the switched network, message holding means responsive to signals generated by the input means for holding words of binary data indicative of a message from the user, each word associated with a particular character in the message, waveform synthesis means for deriving pixel-map data indicative of rows of the perceived shape of the characters associated with the words of binary data, for producing bit streams indicative of the pixel-map data and for synthesizing differential phase-shift key waveforms corresponding to the bit streams by controlling a differential phase-shift key waveform generator for communicating with devices capable of recognizing said differential phase-shift key waveforms, and coupling means for coupling the synthesized waveforms to a transmission line.

In order to better communicate alphanumeric messages from a transmitter to a receiver, a protocol is also provided for communicating messages between a transmitter and a receiver. A transmitter capable of sending such messages is provided which comprises input means for receiving characters from a user and for generating corresponding binary-coded character signals indicative of the received characters, the character signals comprising a number of bits sufficient to permit a unique signal for each of the user-inputtable characters, lookup means with respect to a lookup table having a plurality of rows associated with binary-coded row numbers and two column-pairs associated with a plurality of respective groups, each column-pair comprising two columns each associated with one case of an upper case and a lower case, with ones of the intersections of the rows and columns associated with ones of the unique signals, said lookup means responsive to ones of the character signals indicative of the received characters for determining the row and column associated therewith, for determining the binary-coded row number associated with the row, and for determining the case and group associated with the column, group encoding means having an initial group state and an initial case state, said group encoding means responsive to receipt of a one of the character signals indicative of the received characters for providing the one of the character signals indicative of the received characters to the lookup means and receiving the group and case and binary-coded row number associated with the one of the character signals indicative of the received characters, said group encoding means further responsive to receipt of the group associated with the one of the character signals indicative of the received characters for comparing said group with the previous group state and generating a change-of-group signal in the event of a difference therebetween, said group encoding means further responsive to receipt of the case associated with the one of the character signals indicative of the received characters for comparing said case with the previous case state and generating a change-of-case signal in the event of a difference therebetween, and for generating a row signal associated with the binary-coded row number, the change-of-case and change-of-group signals having the same number of bits as the binary-coded row numbers, queuing means for receiving and queuing the generated signals and for providing the signals in nibbles composed of fewer bits than the number of bits in the binary-coded row numbers, and analog means for receiving the nibbles, for producing analog signals indicative thereof, and for coupling said analog signals to a transmission line. The protocol can be made to incorporate efficient representation techniques such as Huffman encoding and this can in turn be included as an option on the transmitter using the protocol.

In addition to the transmitter, a receiver is also provided which can receive and decode messages from a transmitter sending messages encoded with this protocol. The receiver also makes use of a lookup table to decode incoming analog signals after they have been digitized, serialized and regrouped into the appropriate digital bit length.

BRIEF DESCRIPTION OF THE DRAWINGS

The exemplary embodiment will be explained with respect to a number of figures, of which:

FIG. 7 shows in tabular form a five-bit encoding system for displayable characters;

FIGS. 8A and 8B taken together show in tabular form a six-bit encoding system for displayable characters;

FIGS. 9A and 9B show in character order a Huffman encoding scheme;

FIGS. 9C and 9D show in bit-length code order a Huffman encoding scheme;

FIG. 17 shows in tabular form one set of corresponding values used in decoding four, five, six-bit and Huffman encoded data;

FIG. 19 illustrates five-bit and six-bit encoding of a sample message according to the tabular structure shown herein;

FIG. 24 shows in tabular form a set of predetermined messages to be exchanged between transmitter and host to indicate the type of message being communicated; and FIG. 25 illustrates five-bit decoding of a sample message.

DETAILED DESCRIPTION OF THE PREFERRED EMBODIMENT

Figure 4:
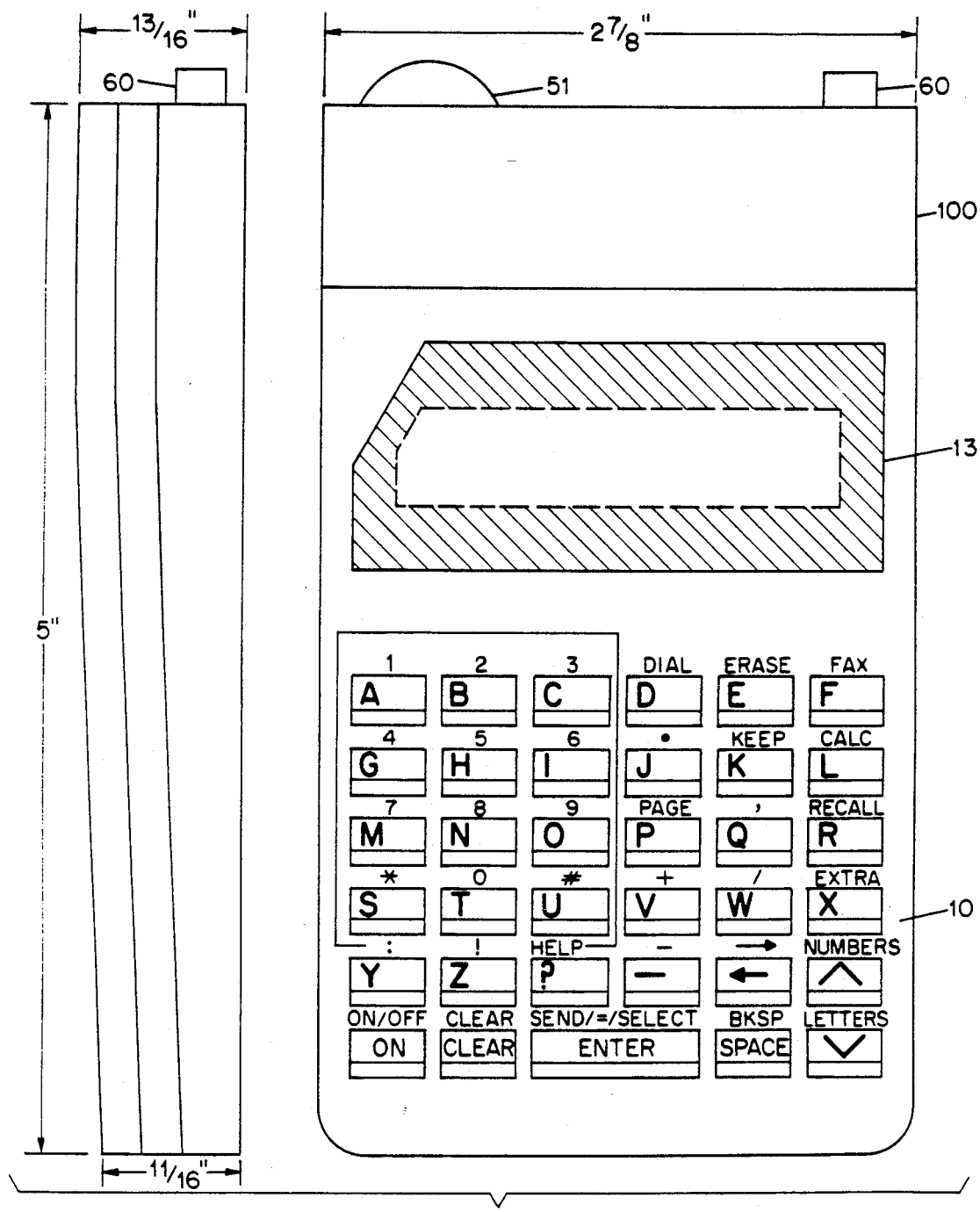
FIG. 4 shows front and side views of the transmitter of FIG. 1.

FIG. 4 shows front and side views of a handheld message transmitter in accordance with an embodiment of the present invention. The transmitter 100 is capable of sending alphanumeric messages to Group III facsimile machines and to paging terminals using a variety of data communication protocols. The transmitter is designed to provide a variety of user functions including calculator, clock, calendar and electronic date book functions in addition to providing a means for communicating alphanumeric messages to message receivers.

The external case of the transmitter 100 includes a keypad 10, an LCD display 13, a volume control 51 and a phone line connector 60. The dimensions and weight of the transmitter are such that the entire transmitter can be easily held in the palm of one's hand and can fit into one's shirt pocket. The phone jack 60 provides a means of connecting the transmitter 100 via a connecting cord (not shown) to a switched network such as a telephone line. The volume control knob 51 is a potentiometer for adjusting the output of an internal piezoelectric transducer or speaker. The internal speaker provides the user with a key click sound to tell the user that a key in the keypad 10 has been depressed, and also provides the user with a means of monitoring the telephone line when the transmitter is trying to establish communication with the selected message receiver.

Figure 1:
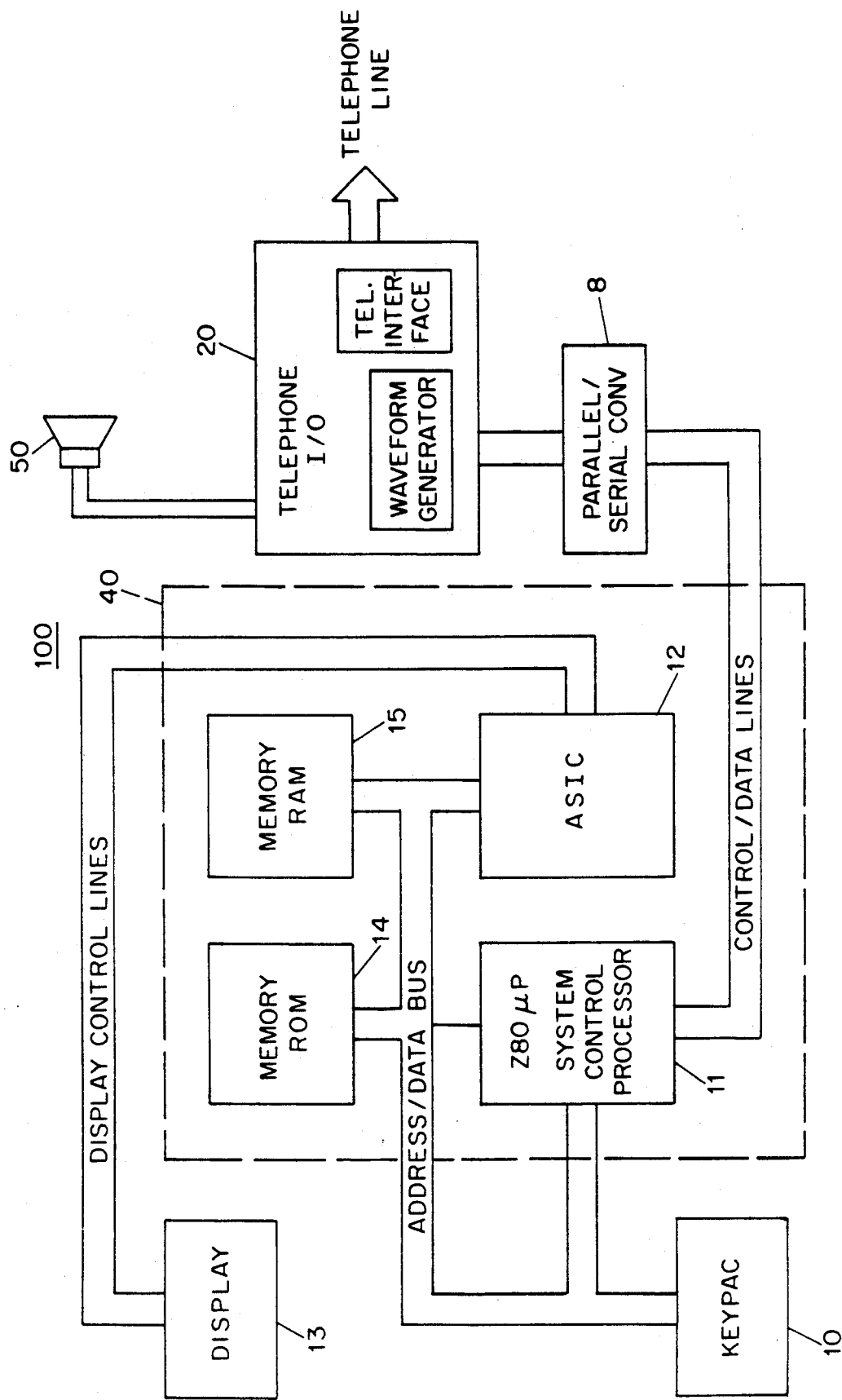
FIG. 1 is a system block diagram of a handheld message transmitter in accordance with an embodiment of the present invention.

A system block diagram for the above transmitter 100 is shown in FIG. 1. A keypad 10 and system controller 40 are coupled to an address/data bus of the transmitter. System controller 40 monitors the address/data bus lines and detects input signals from the keypad 10. These signals are decoded by the system controller 40 which provides corresponding control signals to the LCD display 13, the telephone input/output subsystem 20 and a speaker 50. The keypad 10 and the display 13 together with associated software provide a means for the user to control all the functions of the transmitter 100. The keys are multifunctional keys: they can be used as alphanumeric character keys to enter alphanumeric data, and as command function keys to control the operation of the transmitter. The use of multifunctional keys, as shown in FIG. 4, helps to minimize space requirements for the keyboard.

LCD display 13 provides user information by displaying messages, command requests, system progress signals and a cursor indicative of the mode of operation of the transmitter. Because of size constraints, the LCD display 13 can only display a limited number of alphanumeric characters at a time. When a greater number of characters is provided to the display 13 than can be displayed at any one time, the system controller 40 allows a user to scroll through the displayable characters with the use of directional keys on the keypad. The LCD display is controlled generally through the system controller 40 shown in FIG. 1.

As shown in FIG. 1, the system controller 40 of the transmitter 100 consists of a Z80 microprocessor 11, ROM memory 14, RAM memory 15, an Application Specific Integrated Chip ("ASIC") 12, and various address/data and control lines. The ASIC 12 has lines which are connected directly to segment and backplane electrodes of the LCD display 13 and includes circuitry which updates the electrodes sufficiently to refresh the display 13. In addition to this display control function, the ASIC 12 also controls the memory management of the transmitter, including bank switching. Because the Z80 may address only 64k of memory directly with its address lines, memory banking operations need to be performed to access additional memory required by the system. Upon the receipt of a change bank signal from the Z80 microprocessor 11, the ASIC 12 is programmed to select and latch the appropriate bank of memory to be addressed by the Z80 microprocessor. The ASIC 12 also provides power up, power down and real time display and updating functions.

The Z80 microprocessor 11 provides all the human interface and high level program management for the system controller 40. For instance, the Z80 microprocessor 11 reads the keys of the keypad 10, manages scrolling of the display 13, manages data files stored in memory and runs the calculator, directory, fax send and paging communication programs stored in the ROM 14 and RAM 15 memory. The transmitter operational functions will be further explained below.

In addition to the system controller 40, the transmitter has a telephone input/output interface 20 (hereinafter TIO). Eight bits of parallel data may be sent by the Z80 microprocessor 11 through a parallel-to-serial converter 8. As explained below, the TIO 20 functions to produce synthesized waveforms to be placed over a communication channel according to instructions received from the Z80 microprocessor 11.

Figure 3:
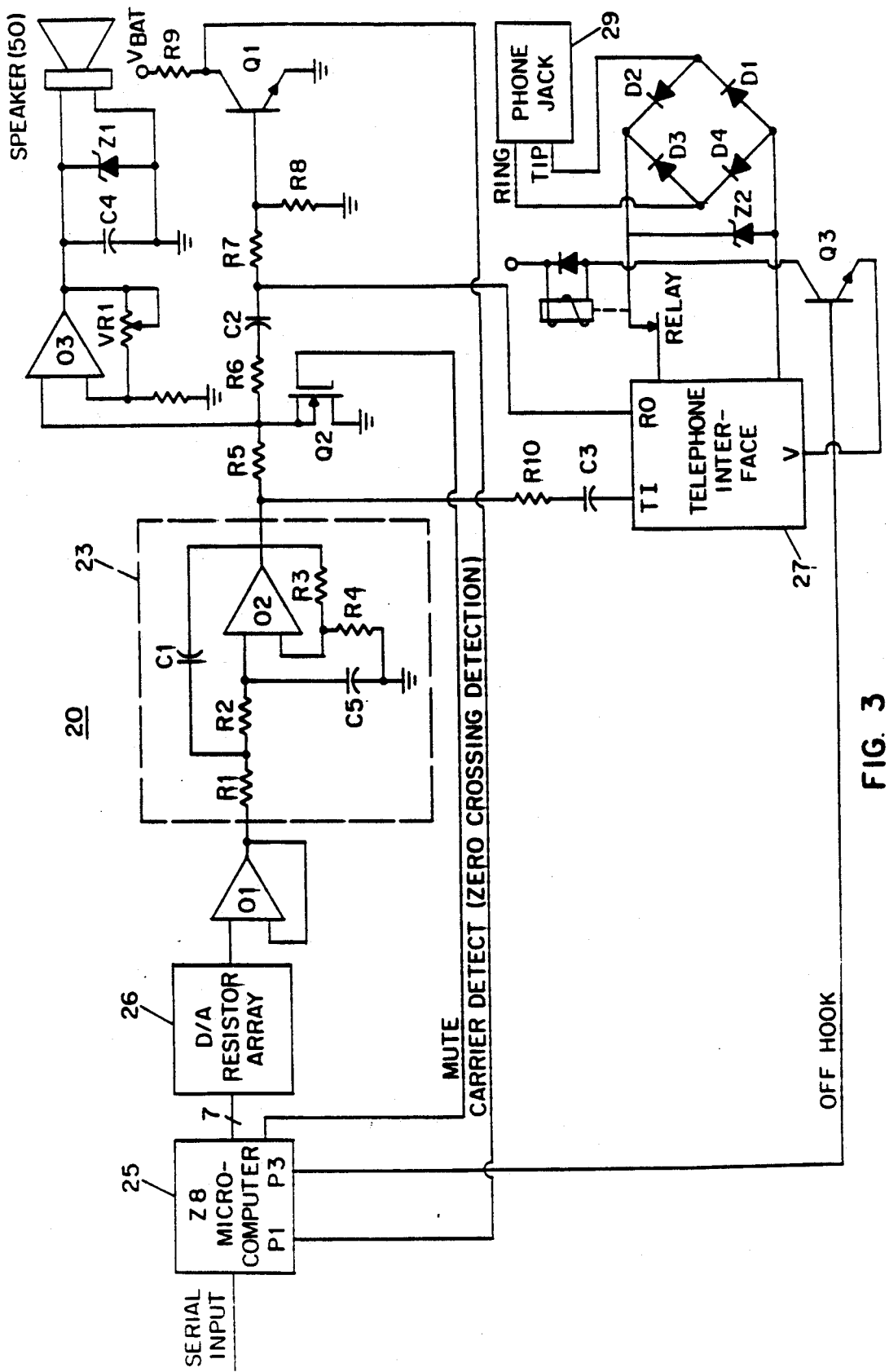
FIG. 3 shows in schematic form the analog circuitry relating to the telephone line interface of the transmitter of FIG. 1.

FIG. 3 shows a more detailed block diagram of the TIO 20. In FIG. 3, a Z8 microcomputer 25 receives serial bits of data from the parallel-to-serial converter 8. The Z8 microcomputer 25 includes an internal processor, ROM, RAM and registers. Discrete output lines in an output port of the Z8 microcomputer 25 are coupled to a digital-to-analog converter 26. The digital-to-analog converter 26 is preferably a R-2R resistor array, or can be a commercially available D/A chip. The analog signal is then passed through a buffer operational amplifier D1 and a 3.5 kHz lowpass filter 23. The signal is then coupled to a telephone input line TI in a telephone interface chip 27 and to a speaker 50. The telephone interface chip 27 is an MC34014 silicon monolithic integrated circuit available from the MOTOROLA (TM) Company of Phoenix, Ariz. 85036, and the speaker is a common piezo transducer.

If the signal output by the Z8 microcomputer 25 is a signal to be placed over the telephone line, the Z8 microcomputer 25 turns transistor Q3 on. The telephone interface chip 27 then drives the signal received from the low pass filter 23 through a diode bridge and a spike suppression zener diode Z2 to a telephone line by way of a telephone jack 29. If the signal is not one to be placed over the telephone line but is one directed to the speaker 50, transistor Q3 is turned off causing any output to the telephone line to be suppressed. The signal from the low pass filter is carried to the speaker 50 by way of operational amplifier 03. However, the output to the speaker 50 may also disconnected by the Z8 microcomputer 25 by turning transistor Q2 on. This effectively mutes the speaker output. Otherwise, the speaker 50 will produce an audio output corresponding to the signal applied to the operational amplifier 03 as controlled by the variable resistor VR1. The variable resistor VR1 in FIG. 3 corresponds to the volume adjust control 51 in FIG. 4.

The Z8 microcomputer 25 allows a user to monitor the telephone line by turning transistor Q3 on and transistor Q2 off. This effectively takes the transmitter "off hook" and allows the speaker 50 to reproduce the signal received by the transmitter from the telephone line. This speaker function is used to monitor such occurrences as busy signals, money requests by pay telephones and wrong numbers.

Transistor Q1 provides the Z8 microcomputer 25 with a frequency monitor of signals received by the transmitter. The transistor Q1 acts to produce square waves representative of any sinusoidal wave received by the transmitter over the telephone line as driven by the telephone interface chip 27. The coupling of the collector to the Z8 microcomputer 25 allows the Z8 to detect the frequency of any wave by counting the zero crossings. As a result, the Z8 microcomputer 25 may detect carrier signals and other handshake signals received from external message receivers.

Figure 2:
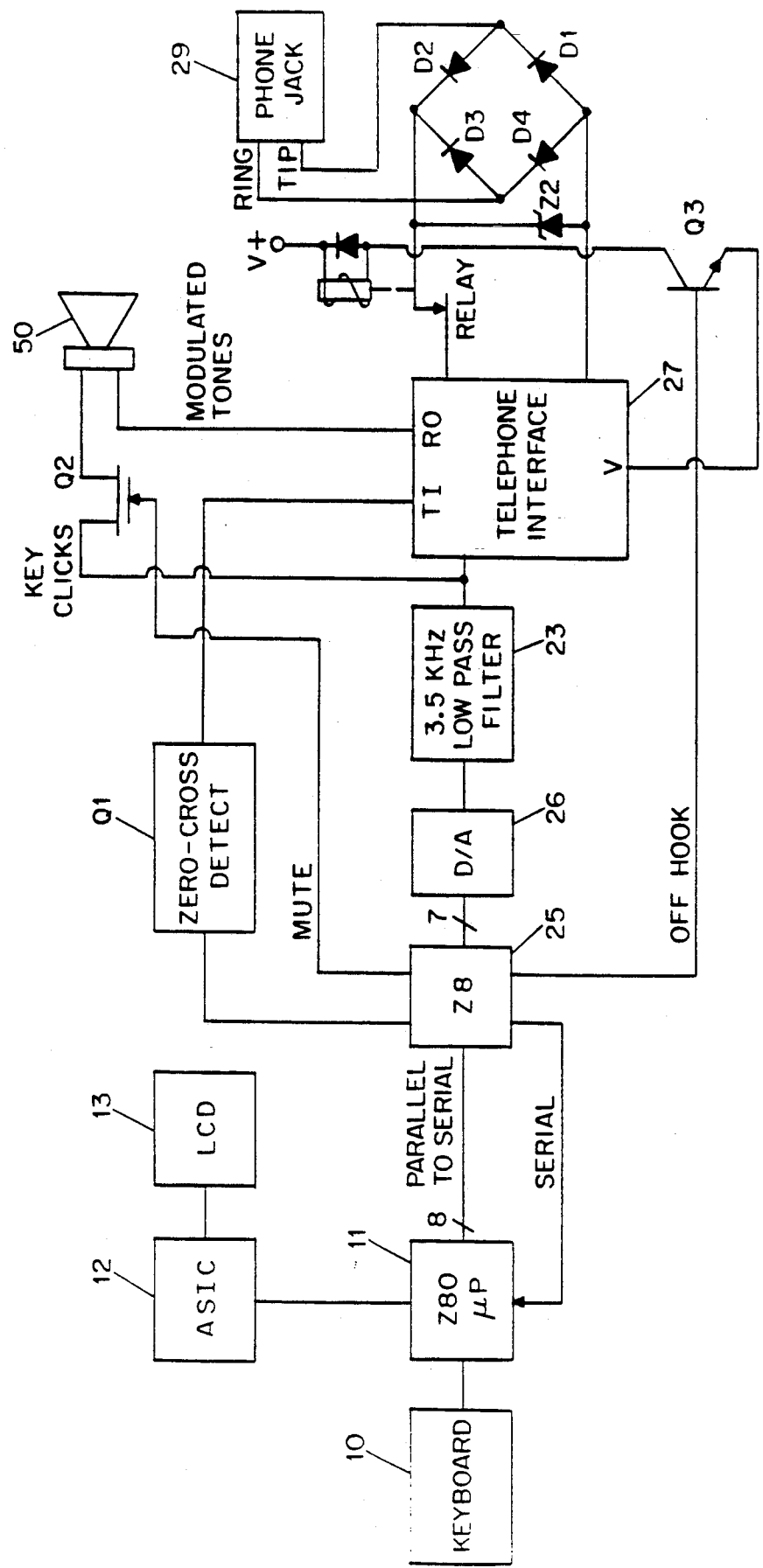
FIG. 2 is a data-flow diagram of the transmitter of FIG. 1 showing data flow from the keyboard to the telephone line.

FIG. 2 shows a data flow chart of a transmitter incorporating the present invention. Data and command signals are received by a microprocessor 11 from the keyboard 10. The microprocessor 11 then acts to display the appropriate output on the LCD display 13 by sending the appropriate signals to the ASIC 12. The ASIC 12 is in turn coupled to the LCD display 13. The ASIC 12 sends the appropriate data signals to the display 13 for the characters selected by the microprocessor 11. The ASIC 12 also functions to refresh data signals to the display 13 to maintain the display until such time as the microprocessor 11 calls for a change in the displayed characters on the display 13.

Signals which are to be delivered to the speaker 50 or telephone jack 29 must be processed through the Z8 microcomputer 25. Eight bit parallel data bytes are delivered from the Z80 microprocessor 11 to Z8 microcomputer 25 through an 8-bit parallel-to-serial converter. The serial data is received by the Z8 microcomputer 25 which processes the data/command received from the Z80 microprocessor 11, as for example, a request to access the speaker or to establish telephone communication. If the Z8 microcomputer 25 has been requested to send data to the telephone line, it passes seven-bit parallel signals through the D/A converter 26 to produce an analog signal which is processed through the above-mentioned 3.5-kHz lowpass filter 23. Depending on instructions received from microprocessor 11, which determine whether the signal is intended for the speaker 50 or the telephone jack 29, the Z8 will direct the signal to either the speaker 50 through the use of its "mute" line coupled to transistor Q2, or the telephone interface chip 27 and the telephone jack 29 with the use of "off hook" transistor Q3.

Transmitter Operating Functions Communication Protocols

The communication protocol used by the transmitter of the present invention could vary according to the communication protocol used by the receiver. Amongst the possible protocols available in the transmitter of the present invention are phase shift keying for communication with Group III fax machines, frequency shift keying for communication with standard paging terminals and a dual tone multifrequency communication protocol further explained herein for more efficiently communicating data to a receiver. The transmitter of the present invention must determine the communication protocol required by the receiver selected by the user to receive a message. The transmitter must then designate a message as being of a particular data type, convert and store the message according to a predetermined format, and subsequently communicate the converted message to a selected receiver through a waveform generator. A more detailed explanation of communication protocols that may be implemented in the transmitter of the present invention are provided below.

Facsimile Transmission

The communication protocol for sending and receiving data from a Group III fax machine has been well documented and described in various literature, such as published CCITT Recommendation A.21, "Collaboration with other International Organizations on CCITT-Defined Telematic Services", pertinent parts include Recommendation T.4 "Standardization of Group 3 Facsimile Apparatus for Document Transmission", pp.16-31, and Recommendation T.30 "Procedures For Document Facsimile Transmission In The General Switched Telephone Network", pp. 69-106. The recommendation by the United Nations organization, which in French stands for the International Consultative Committee for Telephone and Telegraph (CCITT), fully explains all the necessary phases for establishing communication, transmitting data and ceasing the communication between devices. The CCITT standard is a worldwide standard for facsimile machines. See INFOWORLD, Mar. 25, 1991, Vol. 13, Issue 12, P. 31.

The protocol set forth in the above literature is implemented in the transmitter of the present invention by the use of the system controller 40 and the TIO 20, as shown in FIG. 1. The user selects a message to be delivered to a group 3 facsimile machine by the use of the keypad 10. The user then selects the phone number of the facsimile machine to receive the message from the transmitter. Both the message and the destination device number are stored in memory. The transmitter also allows the option of transmitting the same message to a number of different receivers with different phone numbers. Once the messages and destination phone numbers have been entered by the user and processed by the microprocessor 11, the microprocessor 11 converts the text of the message to a series of phase shift signals representing pixel-map data indicative of the physical representation of the alphanumeric characters in the message. This process is carried out by the microprocessor 11 according to well known CCITT standards. Once the message has been converted to the appropriate sequence of phase shifts, and those phase shifts stored in memory, the microprocessor 11 can initiate a telephone connection to the device (e.g. a telecopier) which is to receive the message.

The microprocessor 11 directs the Z8 microcomputer 25 to access a telephone network (not shown) connected to the above jack 29 in order to deliver the transmission to a receiver. The Z8 microcomputer 25 enables an "off hook" line which activates a relay to seize the line and to obtain a dial tone. Both the user and the Z8 microcomputer 25 may now monitor the telephone line through the speaker 50 and the zero-crossing transistor Q1 line feeding back from the telephone line interface chip 27. Once a dial tone has been received, the Z8 microcomputer 25 delivers the frequency of the signal received back through the telephone line to the microprocessor 11. The microprocessor 11 then instructs the microcomputer 25 to interpret the subsequent data as either touch tone or pulse tone phone numbers that are to be sent over the telephone network. The microprocessor 11 instructs the microcomputer 25 to dial the specified numbers.

In the case of tone signaling, the microcomputer 25 has an internal lookup table which provides appropriate data signals to the D/A converter 26 and through the low pass filter to produce the correct tone signal to be dialed. The telephone line interface chip 27 then drives the signal through the diode bridge and to the telephone line.

In the case of rotary signaling, the microcomputer activates the line-seizure relay according to well known and specified timings and duty cycles to simulate rotary dialing.

After dialing the telephone number, the microprocessor 11 waits to receive a group 3 tone over the telephone line as fed back by the telephone line interface chip 27 back through the microcomputer 25 and delivered as serial data bit stream to the microprocessor 11. Once the appropriate tone is received, the microprocessor 11 instructs the microcomputer 25 to receive phase shift keying dibit signals for transmitting group 3 facsimile messages, and begins delivering dibits of information to the microcomputer 25. The microcomputer 25 begins processing the dibits as it receives the information and stores the additional dibits in a buffer until it is able to process them. The dibits represent phase shifts in the 1800-Hz carrier frequency recognized by group 3 facsimile machines, as called for by the CCITT standard.

Figure 10:
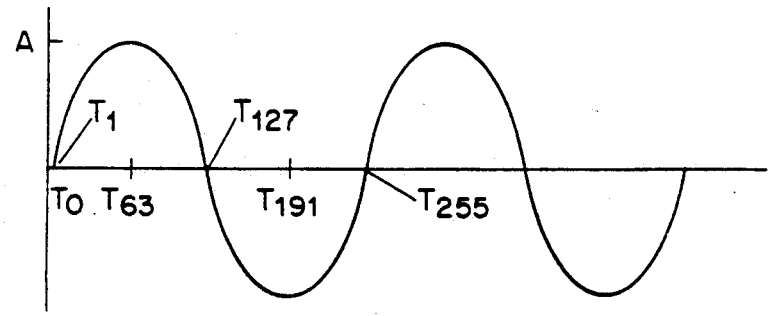
FIG. 10 shows a generic sine waveform to be synthesized or approximated.
Figure 11:
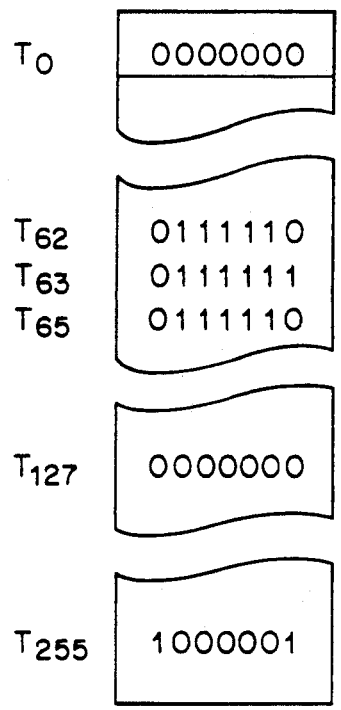
FIG. 11 shows in partial view a table of values for use in synthesizing or approximating a sine waveform.
Figure 12:
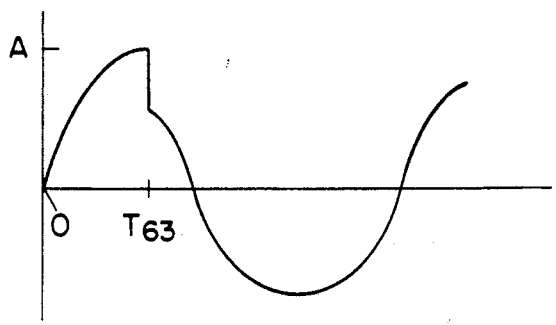
FIG. 12 shows the wave shape of a sine wave including a phase-change transition.

As shown in FIGS. 10 and 11, the 1.800 Hz carrier frequency is produced by the microcomputer 25 according to a lookup table and a table index pointer. A sine wave of a unit amplitude is divided into 256 equally spaced time amplitude values, i.e. T0, T1, T2 ... T255. The amplitude values are stored in the microcomputer's 25 memory with an index pointer set initially at T0. The index points to the value which is to be output by the microcomputer 25 to the D/A converter 26. The index is displaced a sufficient number of times per second to be within the plus or minus 1-Hz error region allowed for group 3 facsimile machines. The index is sufficiently updated to produce the 1800 Hz sine wave until a dibit is received from the microprocessor 11 to indicate a change in phase is needed for the sine wave. When the microcomputer 25 receives a change in phase dibit, the microcomputer 25 calculates how far ahead the index needs to be displaced in order to produce the phase shift desired by the microprocessor 11 requested by the dibit. Once the index is displaced the index will sample the lookup table at the same rate it did before receiving the change in phase dibit in order to retain the 1800 Hz sine wave. In generating a phase shift, the displacement of the index from the next normal position provides a phase shift in proportion to the number of entries skipped. For instance, in FIG. 12 the index is updated after T63 to represent a 45-degree phase shift in the sine wave by advancing the index from T64 to T97. The formula for calculating the number of amplitude values to ship for a given phase shift is:

$$\text{index displacement} = \frac{\text{number of amplitude values per sine wave}}{1} \times \left[\frac{\text{phase shift (in degrees)}}{360°}\right]$$

In the example above, where a 45° phase shift is desired, the index displacement would equal $$\frac{256 \text{ values}}{\text{sine wave}} \times \left(\frac{45°}{360°}\right) = 32 \text{ values}$$

Assuming the next amplitude value would have been T65, the index pointer would skip 32 values forward to T97. This would in effect generate a 45° phase shift in the 1800 Hz output carrier frequency of the transmitter.

The microcomputer 25 updates the index until it receives an end of transmission (EOT) signal from the microprocessor 11. Upon the receipt of an EOT signal from the microprocessor 11, the microcomputer 25 sends an EOT signal to the facsimile machine and begins the termination process for group 3 facsimile machines as defined by the CCITT, which requires an EOT acknowledge signal from the facsimile machine. The tone generated from the facsimile machine is detected by the zero-crossing transistor Q1 in the telephone input/output circuit 20 and delivered to the microprocessor 11 which instructs the microcomputer 25 to terminate communication over the phone line.

Figure 13:
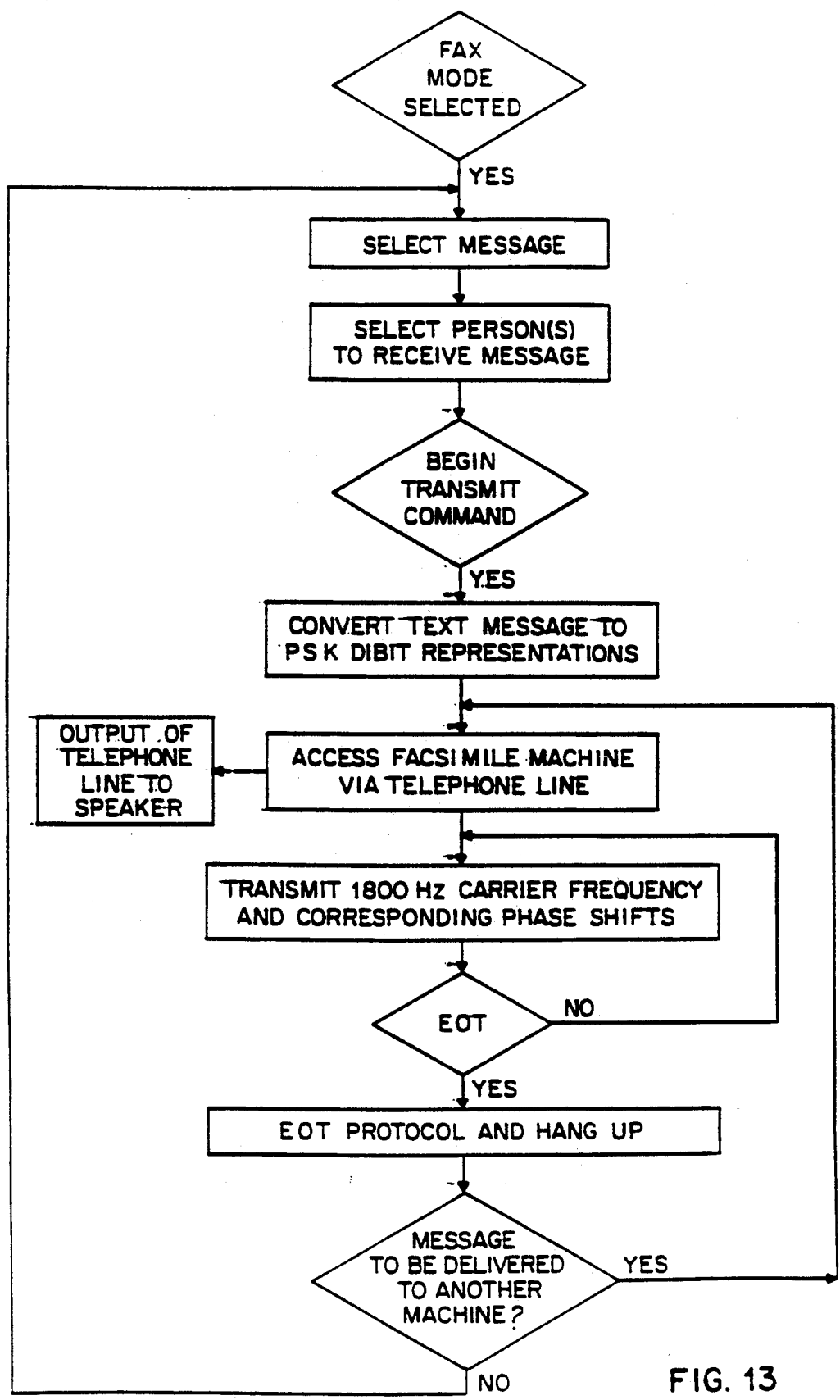
FIG. 13 shows part of a flowchart showing in block diagram form the steps of sending a facsimile message.

The above steps are outlined in FIG. 13 and are repeated for each message that needs to be sent by the transmitter.

Dual Tone Generation

Figures 14, 15:
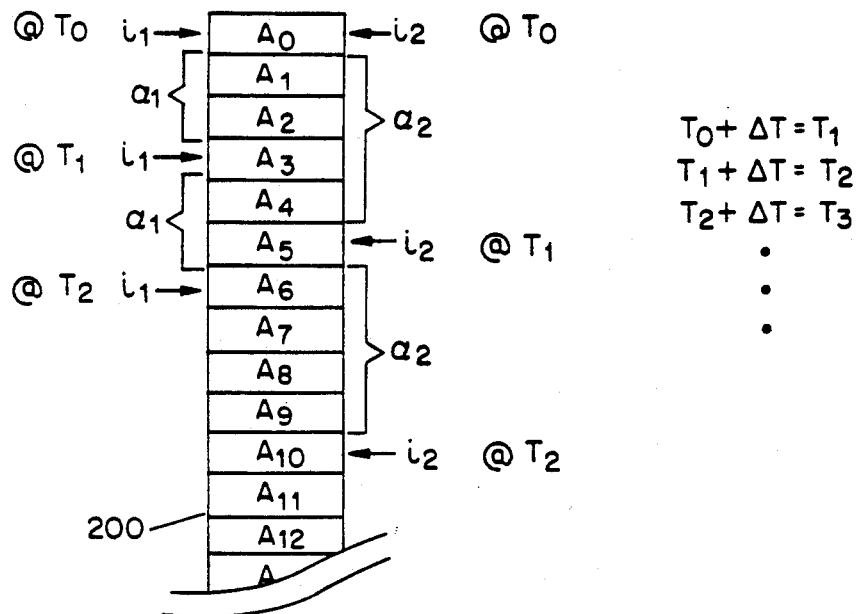
FIG. 14 shows in tabular form the frequencies of the sixteen standardized DTMF (dual tone multifrequency) signaling tones and the nibbles they represent in binary and hexadecimal code.
FIG. 15 illustrates a DTMF waveform generation technique.

The generation of dual tone modulated frequencies (DTMF) is used to dial phone numbers in a touch tone mode of operation and to communicate messages over a telephone line using a DTMF communication protocol explained below. As shown in FIG. 14, DTMF operation requires the production of sine waves of different frequencies and combining two of them to produce a distinct signal identifiable by a receiver. For example, a DTMF tone signal 3 is produced by generating a 1477-Hz sine wave and a 697-Hz sine wave; as described below, the two sine waves are combined in software to form a single dual-tone waveform. In order to produce sixteen DTMF signals four high frequencies and four low frequencies need to be produced by the system. The high frequencies are 1209 Hz, 1336 Hz, 1477 Hz and 1633 Hz. The four low level frequencies are 697 Hz, 770 Hz, 852 Hz and 941 Hz. DTMF signals 0-9 in FIG. 14 are used to generate the standard touchtone telephone signals over the phone lines in order to connect with a receiver through the telephone switching network. DTMF signals shown as hexadecimal values A-F are used to communicate with message receivers according to protocols described below.

The DTMF signals are produced in the transmitter by the telephone input/output circuit in FIG. 3. The microcomputer 25 receives a binary bit representation of one or another of the sixteen possible DTMF combinations from the microprocessor 11 in the system controller. The binary nibble is interpreted by the microcomputer 25 according to the chart in FIG. 14 and the microcomputer generates binary representations of the sum of the two frequencies corresponding to the DTMF digit to be placed over the telephone line.

The microcomputer 25 generates sine waves by using a lookup table and index pointers as described with the facsimile transmission method discussed above. Because two frequencies need to be produced, two different index pointers are provided. As mentioned above, one period of a sine wave is stored in a table representing a number of equally spaced time intervals. However, because of the symmetrical nature of the sine wave, only a portion of the wave needs to be placed in memory. The run-time software could dynamically exploit symmetries in sine wave polarity and slope to compress the stored wave form. This would have the benefit of reducing required memory storage area but would consume some of the available computational bandwidth of the synthesis software. In the simple case the entire sine wave is being stored in the table.

Because the microcomputer 25 is adding two sine waves together when producing DTMF signals, the sine wave table used for DTMF is different from the single tone frequency table. The addition of the two sine waves may produce amplitudes exceeding the rated value of the D/A converter 26 in the TIO circuit 20 thereby causing "clipping" of the signal as shown in FIG. 15. To avoid clipping of the DTMF tone signal, the sine wave table for the DTMF generation is scaled down to half amplitudes to avoid exceeding the rated value of the D/A converter 26. Optionally this could also be done through the existing sine wave table with additional processing but this would either require additional processing time or additional logic chips. The use of different tables also allows the full use of the quantization range of the D/A converter 26.

In FIG. 15 an example of the generation of DTMF signal of the present invention is provided. The generation of different frequencies is done by setting the initial indices to zero, $i_{(1)}$ and $i_{(2)}$, determining the number of samples to be made per second and determining the time increment per sample, $\Delta T$, and then determining the number table entries to be skipped by the index on each sample, $\alpha_{(1)}$ and $\alpha_{(2)}$. This is done for two different frequencies with two different indices. The values of the two indices are summed and an output is generated by the microcomputer 25 to the D/A converter 26 and passed onto the telephone line. The time increment, $\Delta T$, represents the time between samples for both indices, $i_1$, and $i_2$. This value, $\Delta T$, is generally a product of the frequency of the sine waves to be generated and the number of amplitude values in the amplitude table 200. Thus, if a frequency of 1 Hz was desired and the table had 256 amplitude values for one sine wave, 256 samples would be taken per second. Thus, $\Delta T$ would be 1/256 of a second. This assumes, of course, that the 256 entries on the chart provide sufficient accurate results for the desired output. In the instant case, a table of 256 entries has provided sufficient accuracy to produce a 1800 Hz carrier frequency to within (+) or (−) 1 Hz. Indices $i_1$ and $i_2$ would, in FIG. 15, ship $\alpha_1$ and $\alpha_2$ entries, respectively, every $\Delta T$ seconds. Index pointer $i_2$ skips more entries per second than $i_1$ and therefore represents a higher frequency sine wave than $i_1$.

The sample rate is bounded by the Nyquist rate as the minimum rate and by some integer division of the processor clock speed as a maximum. Within this range, the sampling rate is chosen to yield the best mix of frequency errors for the task at hand. Integer indexed table synthesis techniques also have another limitation in that the only frequencies that are an integer multiple of the fundamental table frequency can be accurately reproduced; non-integer multiples will have some frequency error component. As a result of this, a combination of table size, quantization resolution and sampling frequency is chosen that yields optimum results for the most critical frequency used by the transmitter, herein being the 1800 Hz carrier frequency which requires a (+) or (−) 1 Hz accuracy. If the system were simply implementing the DTMF protocol herein described, the system would only need to be as accurate as the DTMF receiver's error margin, which is more forgiving than the Group 3 facsimile protocol provided by CCITT.

Figure 16:
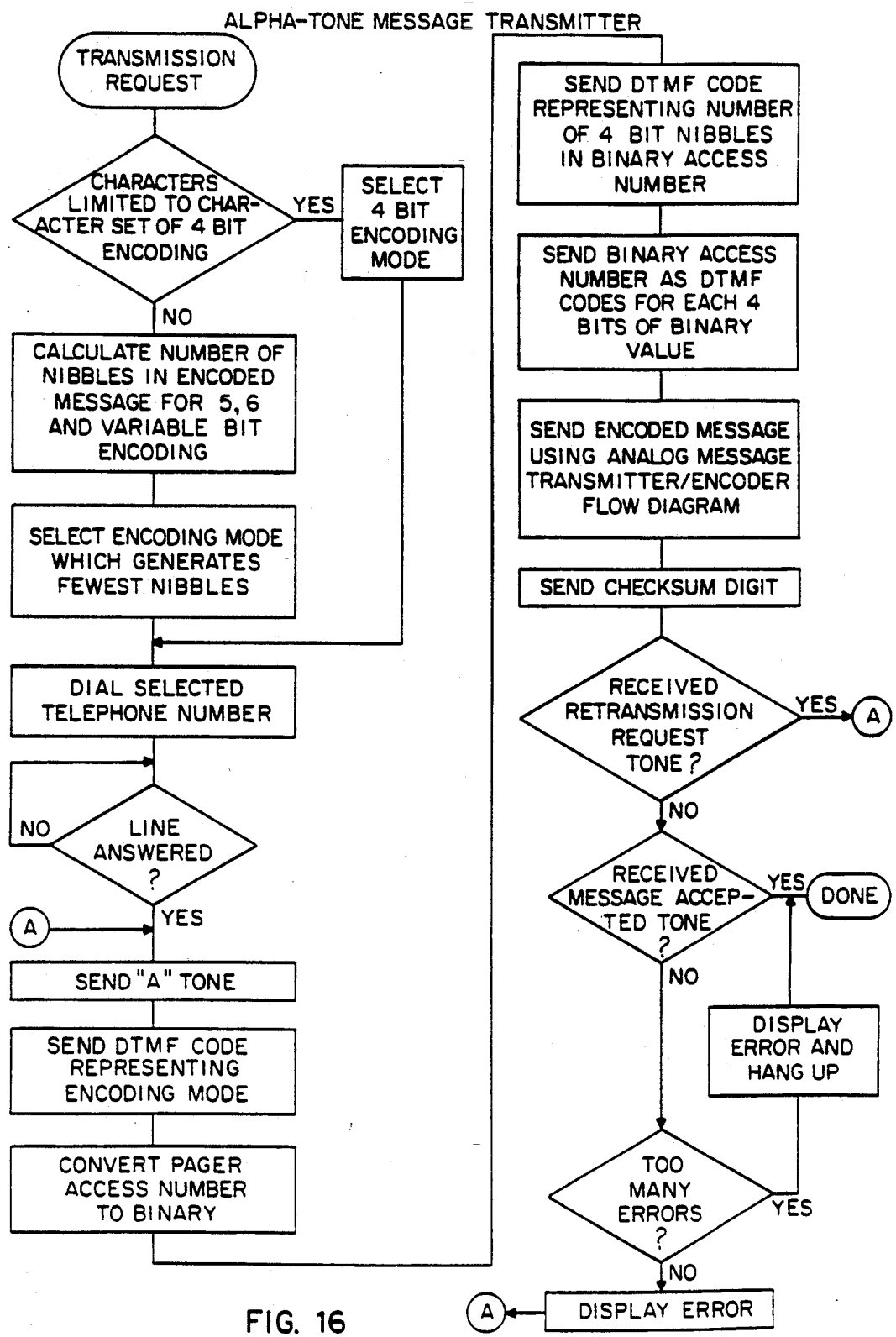
FIG. 16 shows in flowchart form the method for sending messages via the tone protocol according to the invention.

A general flow chart for the tone protocol system using DTMF tones is shown in FIG. 16. In this communication system, there are a number of different character coding representations from which the transmitter may select. The transmitter encodes the message that is to be sent to the receiver according to each format. The format which requires the fewest number of binary bits to represent the entire message is selected as the character encoding format. The binary bit representation is then serialized and "queued", or regrouped, as four-bit nibbles. The transmitter then sends out DTMF tones representative of the four-bit nibbles as in FIG. 14 to the receiver, which in turn decodes the message according to the information initially received from the transmitter regarding the message encoding protocol used.

Figures 5, 6:
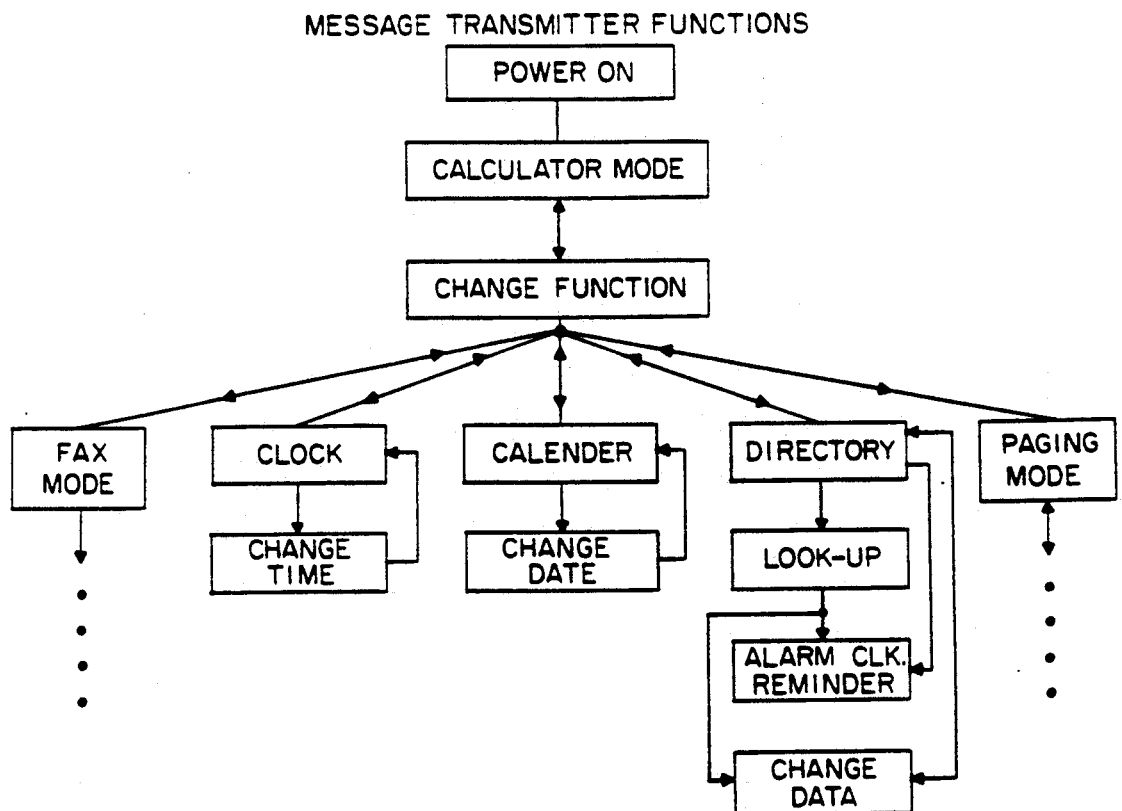
FIG. 5 shows in state diagram form the user menus of the transmitter of FIG. 1.
FIG. 6 shows in tabular form a correspondence between DTMF tones and displayable characters in four bit encoding mode.

The transmitter may select from a number of character coding representations using data compression techniques. The transmitter may represent outgoing characters as 4-bit, 5-bit, 6-bit and variable length binary bit representations. Four-bit encoding may be utilized when the characters in a message consist only of 16 often-used predefined characters, typically numerals only. As shown in FIG. 6, sixteen characters may be represented through the four-bit encoding. In this technique, each character is converted to its four-bit equivalent and the DTMF tone equivalent to that character is transmitted. One character from the sixteen-character set is reserved to indicate the end of transmission.

Five-bit data compression encoding is capable of transmitting the entire printable ASCII character set. Each character is represented by a five-bit value within a group and case designation. As shown in FIG. 7, each five-bit binary representation has two corresponding groups and an upper and lower case in each group. In addition, there are five-bit designations for a "switch group" command, a "switch case within the group" command, and some often-used characters such as the space, comma and period. The transmitter encodes the message according to this coding technique by starting out with an initial group designation and an initial case designation for each group.

Figure 18:
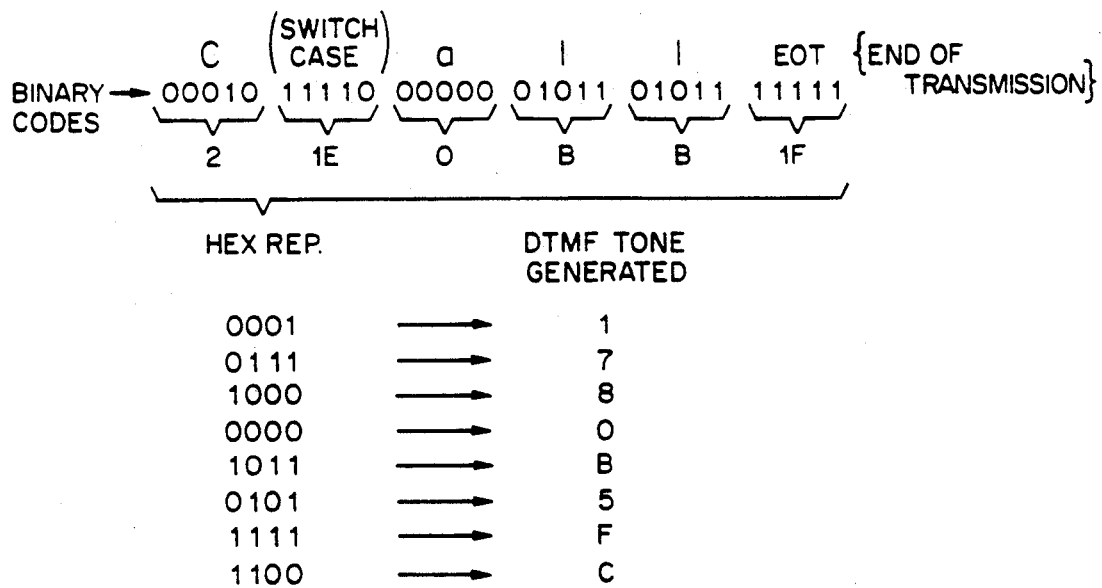
FIG. 18 illustrates the five-bit encoding of a sample message.

For purposes of illustration, e.g., assume group 1 and upper case are the initial designations. The transmitter then inspects the characters in the message to be transmitted. Suppose, for example, the message is "Call". The transmitter encodes the message according to the table, as shown in FIG. 18, and generates a serialized binary bit stream representative of the message. In the example, the first character is a "C" and its five bit representation is "00010". The next character is a lower case "a", thus, the transmitter represents the character by inserting a change-of-case binary bit representation, "11110", and then the appropriate binary row code "00000". Thus, five-bit encoding requires the transmitter to keep track of the group, case and row for each character.

Six-bit encoding is illustrated in FIG. 8. Six-bit encoding is very similar to five-bit encoding except that each group and case column provides for more characters so that fewer change-of-group and change-of-case commands are required. This proves to be more efficient than five bit encoding if the message to be transmitted consists of a greater range of characters because there will not be as great a need for changing groups and columns than there would have been in five bit encoding. As illustrated in FIG. 19, if the message "B>A" is to be transmitted, the five bit encoding would require the following binary bit representations:

| | Five-Bit Binary Representation |
|---|---|
| "B" | 00001 |
| ">" | 11101, 11110, 00011 {change group & case within the group} |
| "A" | 11101, 00000 {change group} |
| | Six-Bit Binary Representation |
| "B" | 100010 |
| ">" | 011110 |
| "A" | 100001 |

Thus, for this message the five-bit representation requires 30 bits of data whereas the six bit representation requires 18 bits of data.

Another mode of encoding data is variable-bit-length encoding. One form of variable-bit-length encoding is called Huffman encoding. In Huffman coding characters that are more commonly used are represented by shorter bit lengths than those characters that are less frequently used. The representations will vary according to the language used and the application of the messages. For instance, the American English language would optimally call for different representations than the Italian language. And if the messages to be transmitted are mostly numeric for a particular application, the coding tables could be changed accordingly. Thus, the representations could be varied to satisfy particular needs. An example of Huffman encoding is given in FIG. 9. Each character representation is set such that each binary sequence identifies a unique character. Thus, a receiver only needs to receive one bit at a time until a character has been uniquely identified. The receiver may continue to receive other binary bits until another character is defined and so on.

FIG. 16 illustrates the operational flow chart of the transmitter sending messages with the above identified encoding methods. Once the transmitter has received a transmission request the transmitter needs to determine if the character set of the message to be transmitted can be defined by four-bit encoding. If so, it will decode the message and begin transmission. Otherwise the transmitter will have to encode the message according to the five, six and variable-bit encoding methods and determine which is the most efficient mode of transmission, i.e. which mode requires the smallest number of binary bits to represent the message.

Once the mode is selected, the transmitter queues the binary-coded data, serializes the binary bits and converts them to four-bit nibbles, each of which may be represented by one of the sixteen DTMF tones. The transmitter then commences transmission of the data by dialing the phone number of the receiver and waiting for a line answer. Once the line is answered the transmitter sends an "A" DTMF tone to signal that it is a transmitter preparing to send a message to the receiver using the tone protocol. The transmitter follows the "A" tone with a DTMF code representation of the encoding mode used by the transmitter as illustrated in FIG. 24. The receiver is now ready to accept and decode the DTMF signals representative of the message to be delivered.

Figure 20:
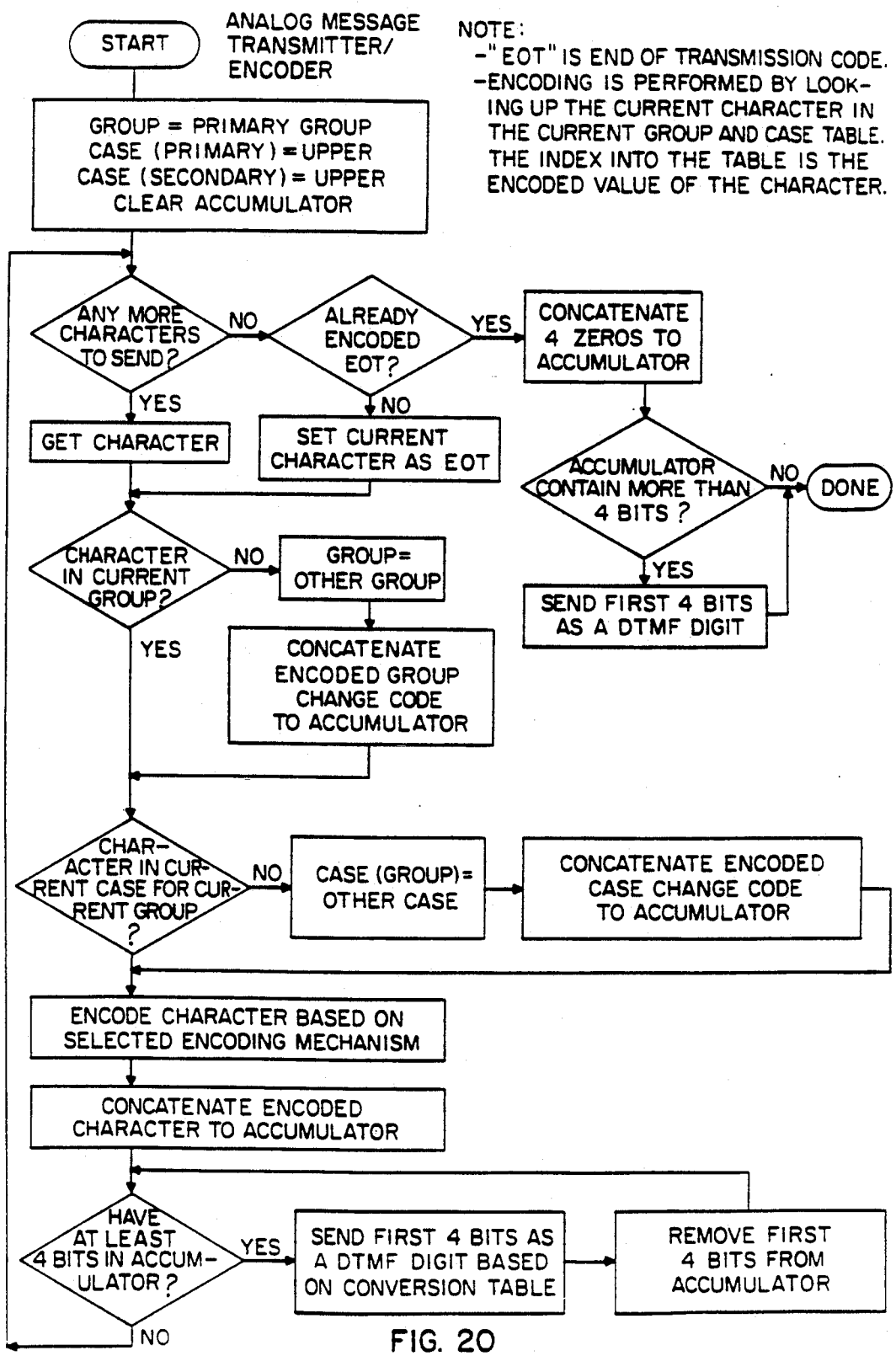
FIG. 20 shows in flowchart form the encoding process for five, six-bit and Huffman coding.

If the receiver is a paging terminal, the next sequence of DTMF signals will represent the pager identification/access number. This is done by first sending a code representative of the length of the pager identification number so that the paging terminal will know when to stop receiving the pager identification number and when to start receiving the message. Once the pager identification/access number is sent the transmitter will begin to send the encoded message according to FIG. 20.

The transmitter will send DTMF tones corresponding to the four-bit nibbles representative of the message to be transmitted until all the four-bit nibbles have been transmitted. At the end, there is a possibility that there are fewer than four bits remaining to be sent. If this is the case, the transmitter will simply add zeros as the least significant bits to generate a four-bit nibble and corresponding DTMF tone. The last character the transmitter will transmit is the EOT (end of transmission) character signal of the particular encoding mode followed by an error-checking checksum value. The error checking checksum is a single hex digit calculated according to the following steps:

1. After "A" tone set checksum to zero
2. For each additional digit in the message:
    1) Add the new digit to the new checksum
    2) AND the result with Hex F
    3) multiply the result by 2
    4) if the result is greater then the decimal value 15, subtract 15 from the result.

Figure 21:
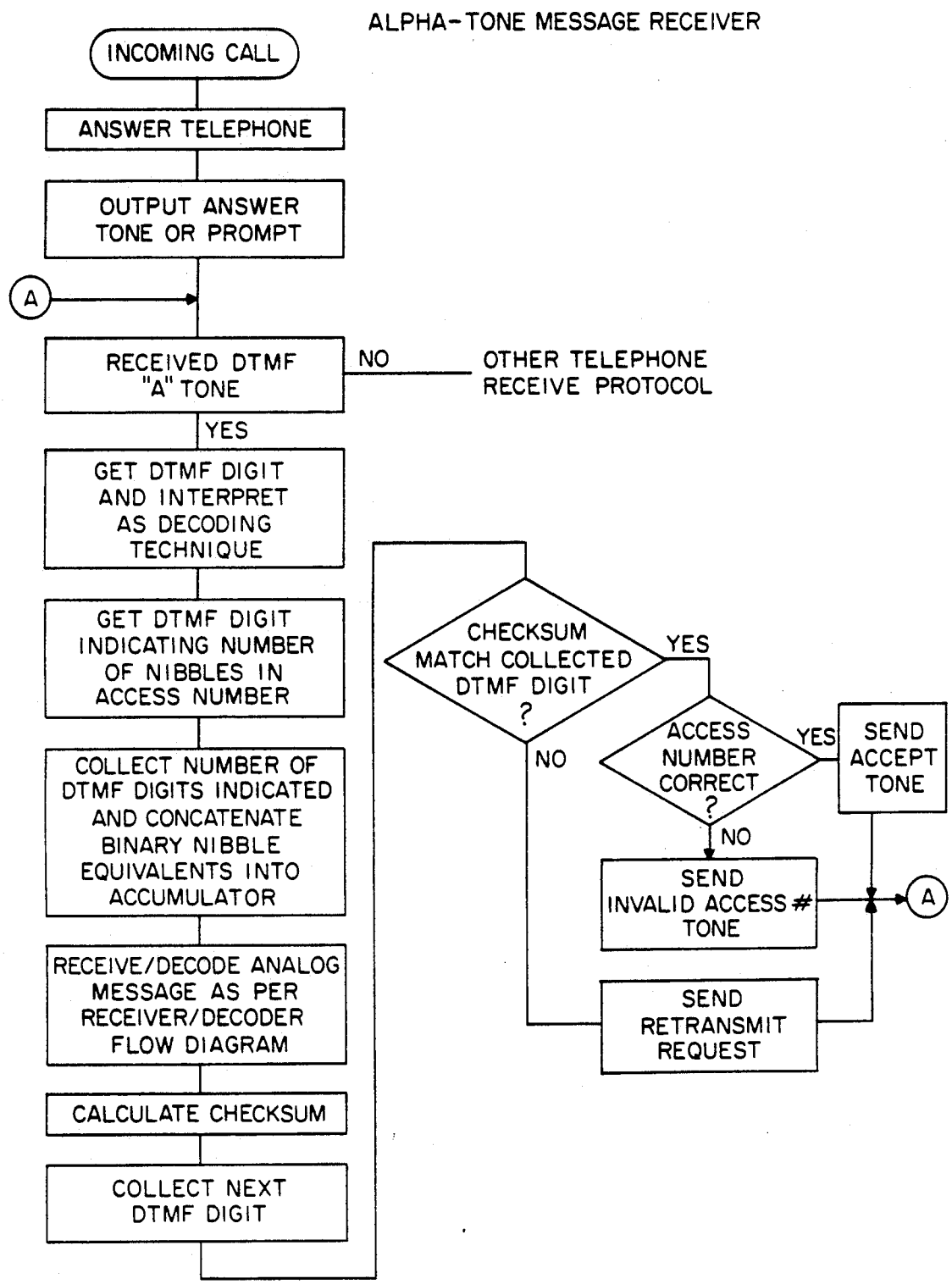
FIG. 21 shows in flowchart form the method for receiving messages via the tone protocol according to the invention encoded data.
Figure 22A:
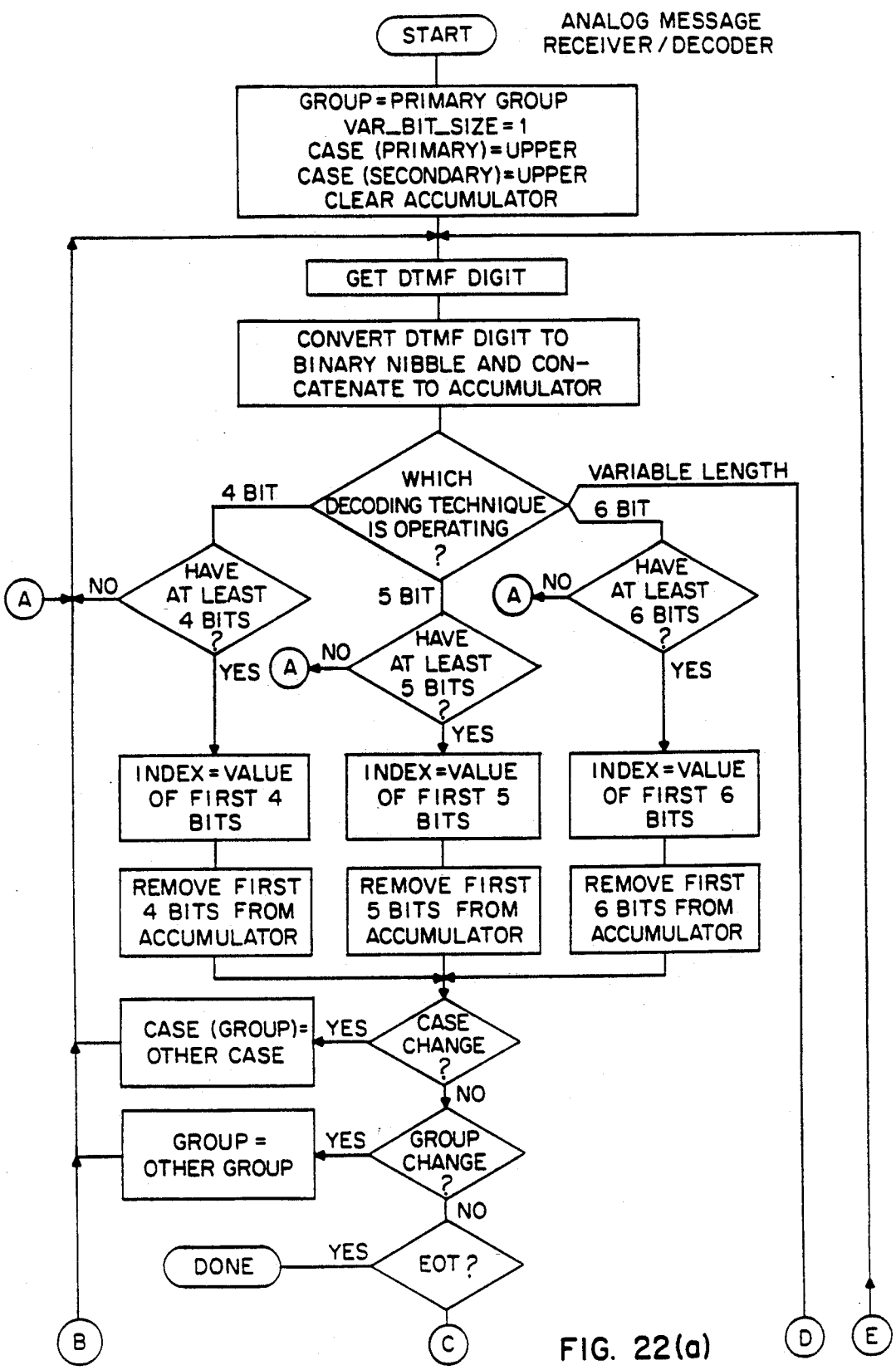
FIG. 22(a) and 22(b) shows in flowchart form the decoding process for four, five, six-bit and Huffman encoded data.
Figure 22B:
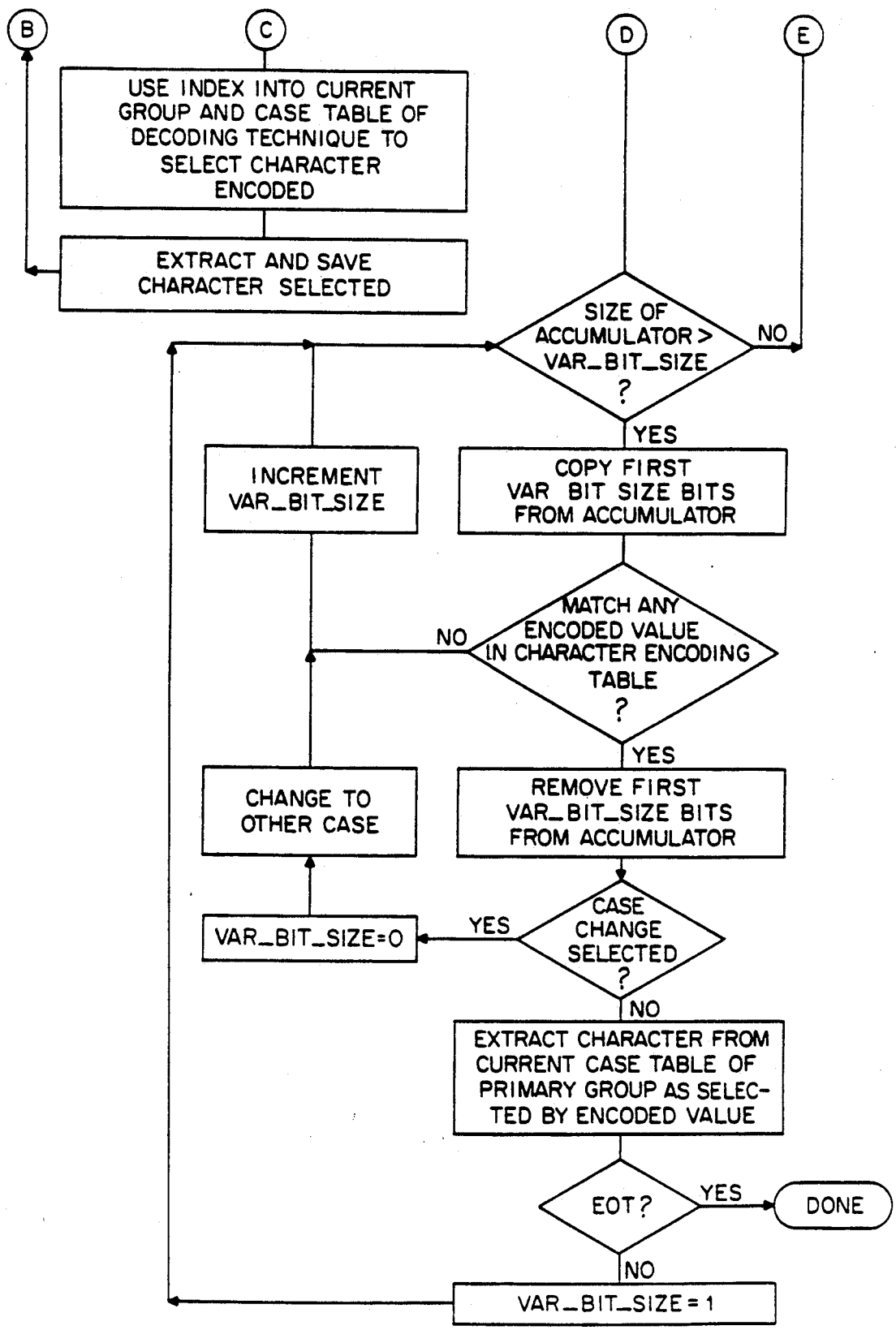

The receiver, like the transmitter, will have an initial group and case designation. As with the transmitter, the initial group is group 1 and the initial case is upper case. The steps required for the transmitter to receive the encoded messages are illustrated in FIGS. 21 and 22(a) and 22(b). The receiver follows the instructions of the transmitter in decoding the DTMF tones after receiving the initial "A" tone, the pager identification signal and the DTMF tone identifying the encoding method to be used. The receiver receives the encoded message and then compares its checksum value to that sent to the receiver in order to detect errors. If a checksum error is detected the receiver will request the transmitter to resend the message to the receiver. If an error other than the checksum error is detected, e.g. invalid page identification or unsupported data compression technique, the receiver will send one of several pure tones listed in Table 1 to the transmitter. The paging terminal has a limited time to produce a pure tone to the transmitter, e.g., 10 seconds, so that the transmitter will know that there is some error if nothing is received back from the receiver within that time period.

TABLE 1

| TONE FREQUENCY | DEFINITION |
|---|---|
| f1 | Page accepted |
| f2 | Checksum error |
| f3 | Page rejected |
| f4 | Unsupported data compression technique utilized |
| f5 | Invalid access number |
| f6 | Alphanumeric message directed to a numeric pager |

The receiver's response tone will transmit for a minimum of 250 ms. If there is another message to be transmitted, that "A" tone of the subsequent encoded message is to be received within 5 seconds of the end of the response tone. If the f4 tone is received, the transmitting device is to retransmit the message limiting its selection of a data compression mechanism only to codes 0 through 3 as defined in FIG. 24. A page rejected tone f3 indicates that the message was received correctly but that the request could not be processed at the present time. The message should be retransmitted at a later time. The f5 tone indicates that the message was received correctly but that the access or pager identification number is not one of a valid customer. The f6 tone indicates that a alphanumeric message was improperly directed to a pager capable of receiving numerals only. If no response tone is heard within the specified timeout period, the transmitting device can attempt a retransmission of the message. The maximum number of retry attempts is defined by the transmitting device.

FIG. 25 illustrates the steps required for a receiver of the present invention to decode the five-bit encoded message "call" in FIG. 18. The steps are reversed from those in FIG. 18 and require reception of the DTMF tones, converting the DTMF tones to four-bit nibbles, serializing and regrouping ("queuing") binary bit nibbles into five-bit codes, and looking up in a table the character values for each five-bit binary code until a end of transmission character is found. As in FIG. 18, FIG. 25 omits depiction of the necessary initial protocols for establishing communication between the transmitter and receiver and the error checking values sent at the end of the message, in order to better explain the coding and decoding techniques of the tone protocol.

Figure 23:
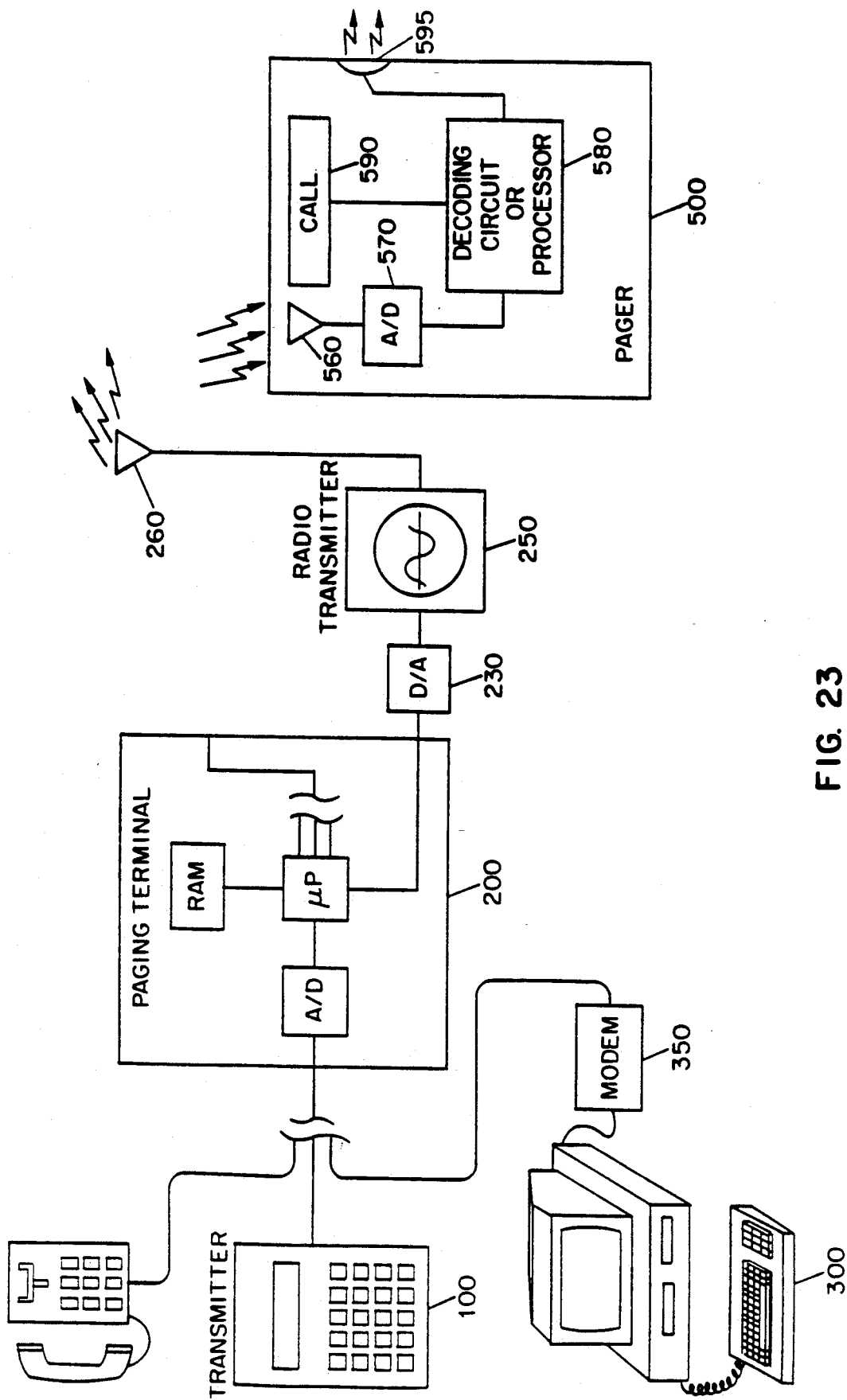
FIG. 23 is a system block diagram of a message transmitting and receiving system in accordance with the present invention.

The character coding techniques described above could be used in a number of different applications other than as described above. For instance, the 4-bit, 5-bit, 6-bit and variable bit encoding technique described above could be used to communicate characters from the paging terminal 200 to a pager 500 via a radio transmitter 250 as described in FIG. 23. As described above and shown in FIG. 23, the character coding methods could be used to communicate messages from the transmitter to the paging terminal over a telephone line with DTMF signals to representing binary bit nibbles. However, the character coding techniques described above could also be used to reduce the transmission time necessary for the paging terminal 200 to communicate messages to a pager.

The paging terminal 200 would only need to communicate the encoded message to a radio transmitter 250 which transmits a radio frequency over the airwaves through an antenna 260. The radio signals would then be picked up by a remote pager 500 Which would decode the message according to the protocol described above.

The binary bit nibbles would be transmitted to the pager 500 according to a number of different techniques presently known in the art. The method chosen would depend on the carrier frequency and bandwidth available to the user and the effective transmitting range desired by the transmitting body. The transmitting technique chosen would have to be recognized by the pager's receiving antenna 560 and its analog-to-digital decoder 570. The binary signal could then be simply decoded by a decoding circuit or processor 580 according to the protocol described above. The pager 500 would then display and/or sound a signal to indicate that a signal was received. Depending on the type of pager used, an alphanumeric or numeric message could be displayed on a display 590 and a "beeping" sound could be activated to a small speaker 595.

One skilled in the art will appreciate that the tone described above, which includes four, five, six and variable-bit encoding could be implemented in any data communication and storage application without straying away from the invention as described herein. There are also very obvious certain slight modifications which could be made in the method described above which would be obvious to one skilled in the art. For instance, communication could still be improved even if DTMF signals were not used. Although DTMF signals are a preferred system of communicating the data between transmitters and receivers, and will be implemented in a protocol system to be marketed under the name "Alpha-Tone" (TM), the protocol could be effectively implemented if the transmitter and receiver were configured to send and receive one bit at a time or by using a DTMF tone with 25 possible outputs rather than the 16 shown herein in order to represent 5 bits per tone rather than the present 4 bits.

Telocator Alphanumeric Protocol

The transmitter of the present invention is also capable of sending messages through the conventional Bell 103 Modem Implementation using the Telocator Alphanumeric Protocol (TM). This TAP standard protocol allows the transmitter to communicate with existing paging terminals which have not implemented the DTMF protocol explained above. The standard for communicating with this protocol is well known in the art and will not be explained in detail herein.

Other Transmitter Functions

As stated above, the transmitter also provides the user with many other functional capabilities. For instance, the transmitter may act as a five-function calculator, a clock, an alarm clock and a timed message reminder. In order to accomplish these functions the transmitter maintains a constant real-time clock for maintaining the proper time and date even when the transmitter is turned off. As represented in FIG. 5, when the transmitter is initially turned on it is automatically turned on in the calculator mode. At that point the user can simply change the mode of operation of the transmitter by selecting the proper key on the keypad 10 of the transmitter which will command the system controller 40 to change operation of the transmitter.

Once the operation of the transmitter is changed to satisfy the needs of the user, the system controller 40 will either request the necessary information for the selected operation or provide an indication that more information.

The transmitter allows a user to maintain a data file called "Directory" which is a data file allowing the user to store in memory the names of people frequently communicated with, their phone numbers, their paging terminal phone number and type, their pager identification number, their facsimile phone numbers and general information block of data for each person. This makes it possible to enter a functional mode such as fax mode, enter a message and select a destination facsimile machine by simply entering the names of the person(s) whose facsimile machines are to receive the facsimile message. Thus, it will not be necessary for a user to enter a person's facsimile number each time a message is to be transmitted to his or her facsimile machine.

In addition, the user has the option of choosing from a number of "canned" messages stored in memory when selecting a message to be transmitted to a receiver. This saves the user from having to type out frequently used messages. The user may simply select a "canned" message to be inserted into the message being transmitted.

To retain what the user has stored in memory, the transmitter will shut down once it detects the internal battery is low. This will save what is in memory and allow the user to replace the battery and retain all that is in memory. In addition the transmitter can also be provided with a user password to prevent unauthorized use of the transmitter and its data files.

Although the transmitter and receiver components listed above represent one embodiment of the present invention, it will be appreciated by those skilled in the art that many modifications could be made to the system without modifying from the spirit of the present invention. For instance, the Z8 microcomputer and Z80 microprocessor could easily be replaced with other similar components and the ASIC 12 could be modified to accomplish more of the logic control in the system than is presently shown. In addition, the DTMF protocol herein described could be implemented not only for sending messages to paging terminals but also as a more general data communication technique.

We claim:

1. A portable hand held message transmitter for use in selecting a destination device capable of receiving synthesized waveforms over a switched network from a plurality of destination devices, said portable hand held message transmitter comprising:
    input means for receiving alphanumeric characters and commands from a user and for generating signals indicative thereof;
    display means for displaying characters indicative of signals provided thereto;
    destination selection means responsive to signals generated by the input means for selecting the destination device from said plurality of destination devices, for establishing a transmission path in the switched network, and for determining a data type for the selected destination device, said data type being one of at least two predetermined data types;
    message holding means responsive to signals generated by the input means for holding words of binary data indicative of a message from the user, each word associated with a particular character in the message;
    waveform synthesis means responsive to the data type being a first one of the at least two predetermined data types, for deriving pixel-map data indicative of rows of the perceived shape of the characters associated with the words of binary data, for producing bit streams indicative of the pixel-map data, and for synthesizing differential phase-shift key waveforms corresponding to the bit streams, whereby the waveforms may be received by a first device type from said plurality of destination devices capable of recognizing said differential phase-shift key waveforms;
    said waveform synthesis means further responsive to the data type being a second one of the at least two predetermined data types, for deriving and queuing binary-coded signals associated with the words of binary data, for providing the signals in nibbles composed of fewer bits than the number of bits in the binary-coded signals, and for synthesizing dual-tone multifrequency waveforms indicative of the nibbles, whereby the waveforms may be received by a second device type from said plurality of destination devices which is capable of recognizing said synthesized dual tone multi-frequency waveforms; and
    coupling means for coupling said synthesized waveforms to a transmission line.

2. The message transmitter of claim 1 wherein the input means comprises a keyboard.

3. The message transmitter of claim 1 wherein the input means comprises a writing tablet.

4. The message transmitter of claim 1 wherein the nibbles are four bits in length.

5. The message transmitter of claim 4 wherein the higher of the dual tones is selected from one of four predetermined frequencies and wherein the lower of the dual tones is selected from one of four predetermined frequencies.

6. The message transmitter of claim 1 wherein the waveform synthesis means is further responsive to the said data type being a third one of the at least two predetermined data types, for queuing the words of binary data, for generating a serial bit stream of the words of binary data, and for synthesizing frequency-shift keyed signals indicative of the bit stream.

7. A portable hand held message transmitter for use in selecting a destination device from a plurality of destination devices, said selected device capable of receiving synthesized waveforms over a switched network, said portable hand held message transmitter comprising:
    input means for receiving alphanumeric characters and commands from a user and for generating signals indicative thereof;
    display means for displaying characters indicative of signals provided thereto;
    destination selection means responsive to signals generated by the input means for selecting the destination device from among the plurality of destination devices, for establishing a transmission path in the switched network, and for determining a data type for the selected destination device, said data type being one of at least two predetermined data types;
    message holding means responsive to signals generated by the input means for holding words of binary data indicative of a message from the user, each word associated with a particular character in the message;
    waveform synthesis means responsive to a first one of the at least two predetermined data types, for deriving pixel-map data indicative of rows of the perceived shape of the characters associated with the words of binary data, for producing bit streams indicative of the pixel-map data and for synthesizing differential phase-shift key waveforms corresponding to the bit streams by controlling a differential phase-shift key waveform generator for transmission to a first device type capable of recognizing said differential phase-shift key waveforms,
    said differential phase-shift key waveform generator comprising
    sinusoidal generation means responsive to a predetermined command generated by the input means for scanning a table having a predetermined number of equally spaced apart entries corresponding to different amplitudes values of a sinusoidal wave with an index pointer, the amplitude of the established signal selected resulting from the scanning of different table entries by the index pointer, thereby generating a sinusoidal carrier frequency,
    phase shift means responsive to the contents of the bit stream for changing the index pointer sufficiently to change the phase of the sinusoidal signal delivered to the selected destination;

said waveform synthesis means further responsive to the said data type being a second one of the at least two predetermined data types, for deriving and queuing binary-coded signals associated with the words of binary data, for providing the signals in nibbles composed of fewer bits than the number of bits in the binary-coded signals, and for synthesizing dual-tone multifrequency waveforms indicative of the nibbles, whereby the waveforms may be received by a second device type from said plurality of destination devices, which is capable of recognizing said synthesized dual tone multi-frequency waveforms; and coupling means for coupling said synthesized waveforms to a transmission line.

8. A portable hand held transmitter as described in claim 7, wherein the switched network is a public switched telephone network.

9. A portable hand held transmitter as described in claim 7, wherein the sinusoidal carrier frequency is 1800 Hz.

10. A transmitter for communicating characters comprising:

input means for receiving characters from a user and for generating corresponding binary-coded character signals indicative of the received characters, said character signals comprising a number of bits sufficient to permit a unique signal for each character receivable by the input means;

lookup means with respect to a lookup table having a plurality of rows associated with binary-coded row numbers and two column-pairs associated with a plurality of respective groups, each column-pair comprising two columns each associated with one case of an upper case and a lower case, wherein the intersections of ones of the plurality of rows and ones of the two columns are associated with ones of the character signals, said lookup means responsive to ones of the character signals indicative of the received characters for determining the row and column associated therewith, for determining the binary-coded row number associated with the row, and for determining the case and group associated with the column;

group encoding means having an initial group state and an initial case state, said group encoding means responsive to receipt of an one of the character signals indicative of the received characters for providing the one of the character signals indicative of the received characters to the lookup means and receiving the group and case and binary-coded row number associated with the one of the character signals indicative of the received characters, said group encoding means further responsive to receipt of the group associated with the one of the character signals indicative of the received characters for comparing said group with the previous group state and generating a change-of-group signal in the event of a difference therebetween, said group encoding means further responsive to receipt of the case associated with the one of the character signals indicative of the received characters for comparing said case with the previous case state and generating a change-of-case signal in the event of a difference therebetween, and for generating a row signal associated with the binary-coded row number, the change-of-case and change-of-group signals having the same number of bits as the binary-coded row numbers, queuing means for receiving and queuing the generated signals and for providing the signals in nibbles composed of fewer bits than the number of bits in the binary-coded row numbers, and analog means for receiving the nibbles, for producing analog signals indicative thereof, and for coupling said analog signals to a communication channel.

11. The system of claim 10 wherein the input means comprises a keyboard and the communication channel is a transmission line.

12. The system of claim 10 wherein the input means comprises a writing tablet and the communication channel is a transmission line.

13. The system of claim 10 wherein the input means comprises a telephone transmission line and the communication channel is a radio frequency broadcast system.

14. The system of claim 10 wherein the input means comprises a keyboard and the communication channel is a radio frequency broadcast system.

15. The system of claim 10 wherein the nibbles are four bits in length, and wherein the analog signals are dual-tone multifrequency signals.

16. The system of claim 15 wherein the higher of the dual tones is selected from one of four predetermined frequencies and wherein the lower of the dual tones is selected from one of four predetermined frequencies.

17. The system of claim 10 wherein the characters include letters from an alphabet having upper and lower case letters, and wherein the lookup table assigns each pair of corresponding upper and lower case letters to a particular row and to a particular column-pair.

18. The system of claim 10 wherein the characters include letters from the Roman alphabet and the number of bits of the binary-coded row numbers is five.

19. The system of claim 10 wherein the characters include letters from the Roman alphabet and the number of bits of the binary-coded row numbers is six.

20. The system of claim 10 wherein the lookup means, the group encoding means, and the queuing means each comprise a processor and a memory, the processor executing a stored program in the memory, whereby the processor receives characters from the user and provides nibbles to the analog means.

21. The system of claim 20 wherein the nibbles are four bits in length, and wherein the analog signals are dual-tone multifrequency signals, whereby the dual-tone multifrequency signals communicate the characters from the user.

22. The system of claim 21 wherein the higher of the dual tones is selected from one of four predetermined frequencies and wherein the lower of the dual tones is selected from one of four predetermined frequencies.

23. The system of claim 10 wherein the number of bits of the binary-coded row number is four.

24. A transmitter for communicating characters comprising:

input means for receiving characters from a user and for generating corresponding binary-coded character signals indicative of the received characters, said character signals comprising a number of bits sufficient to permit a unique signal for each character receivable by the input means and to be indicative of a character case associated with each of the received characters;

lookup means with respect to a lookup table having a binary bit representation for selected character signals, wherein the binary bit representation provides relatively shorter unique binary bit representation for frequently used characters and relatively longer binary bit representations for less frequently used characters;

group encoding means having an initial previous character case state, said group encoding means responsive to receipt of an one of the character signals indicative of the received characters for providing the one of the character signals indicative of the received characters to the lookup means and receiving the binary bit representation associated with the one of the character signals indicative of the received characters, said group encoding means further responsive to receipt of the binary bit representation associated with the one of the character signals indicative of the received characters for comparing the character case of the character signals indicative of the received characters with the previous character case state of the group encoding means and generating a change-of-case signal and an update previous character case state signal in the event of a different therebetween, queuing means for receiving and queuing the generated binary bit representations and for providing the representations in nibbles composed of different number bits than the number of bits in the Huffman binary bit representation, and analog means for receiving the nibbles, for producing analog signals indicative thereof, and for coupling said analog signals to a communication channel.

25. The system of claim 24 wherein the input means comprises a keyboard and the communication channel is a transmission line.

26. The system of claim 24 wherein the input means comprises a writing tablet and the communication channel is a transmission line.

27. The system of claim 24 wherein the input means comprises a telephone transmission line and the communication channel is a radio frequency broadcast system.

28. The system of claim 24 wherein input means comprises a keyboard and the communication channel is a radio frequency broadcast system.

29. The system of claim 24 wherein the nibbles are four bits in length, and wherein the analog signals are dual-tone multifrequency signals.

30. The system of claim 29 wherein the higher of the dual tones is selected from one of four predetermined frequencies and wherein the lower of the dual tones is selected from one of four predetermined frequencies.

31. The system of claim 24 wherein the characters include letters from an alphabet having upper and lower case letters.

32. The system of claim 24 wherein the characters include letters from the Roman alphabet and the number of bits of the Huffman representation varies from two to twenty-two.

33. The system of claim 24 wherein the lookup means, the group encoding means, and the queuing means each comprise a processor and a memory, the processor executing a stored program in the memory, whereby the processor receives characters from the user and provides nibbles to the analog means.

34. The system of claim 33 wherein the nibbles are four bits in length, and wherein the analog signals are dual-tone multifrequency signals, whereby the dual-tone multifrequency signals communicate the characters from the user.

35. The system of claim 34 wherein the higher of the dual tones is selected from one of four predetermined frequencies and wherein the lower of the dual tones is selected from one of four predetermined frequencies.

36. A portable hand held transmitter for communicating characters according to one of a plurality of encoding schemes, said transmitter comprising:

input means for receiving characters from a user and for generating corresponding binary-coded signals indicative of the received characters, said binary-coded character signals comprising a number of bits sufficient to permit a unique signal for each character receivable by the input means;

lookup means for generating at least one corresponding binary bit representation for each of the binary-coded character signals generated by the input means, said lookup means including a lookup table including a plurality of binary bit representations for a select group of characters receivable by the input means wherein one of said plurality of binary bit representations includes a four bit binary representation for each of the select group of characters receivable by the input means group encoding means responsive to receipt of the binary coded character signals from the input means for determining which of the plurality of encoding schemes to transmit the received characters from the input means, for providing the received binary coded character signals to the lookup means and for receiving the corresponding binary bit representations from the lookup means for the binary coded character signals received; and analog means for receiving the binary bit representations from the group encoding means, for producing analog signals indicative thereof, and for coupling said analog signals to a communication channel.

37. The system of claim 36 wherein the input means comprises a keyboard and the communication channel is a transmission line.

38. The system of claim 36 wherein the input means comprises a writing tablet and the communication channel is a transmission line.

39. The system of claim 36 wherein the input means comprises a telephone transmission line and the communication channel is a radio frequency broadcast system.

40. The system of claim 36 wherein the input means comprises a keyboard and the communication channel is a radio frequency broadcast system.

41. A portable hand held message transmitter for use in selecting a destination device from a plurality of destination devices, said selected device are capable of receiving synthesized waveforms over a switched network, said portable hand held message transmitter comprising:

input means for receiving alphanumeric characters and commands from a user and for generating signals indicative thereof;

display means for displaying characters indicative of signals provided thereto;

destination selection means responsive to signals generated by the input means for selecting the destination device from said plurality of destination devices, for establishing a transmission path in the switched network, and for determining a data type for the selected destination device, said data type being one of at least two predetermined data types;

message holding means responsive to signals generated by the input means for holding words of binary data indicative of a message from the user, each word associated with a particular character in the message;

waveform synthesis means responsive to the data type being a first one of the at least two predetermined data types, for deriving pixel-map data indicative of rows of the perceived shape of the characters associated with the words of binary data, for producing bit streams indicative of the pixel-map data, and for synthesizing differential phase-shift key waveforms corresponding to the bit streams, whereby the waveforms may be received by a first device type capable of recognizing said differential phase-shift key waveforms;

said waveform synthesis means further responsive to the said data type being a second one of the at least two predetermined data types, for queuing the words of binary data, for generating a serial bit stream of the words of binary data, and for synthesizing frequency-shift keyed signals indicative of the bit stream whereby the waveforms may be received by a second device type which is capable of recognizing said synthesized frequency-shift keyed signals; and coupling means for coupling said synthesized waveforms to a transmission line.

42. The message transmitter of claim 41 wherein the input means comprises a keyboard.

43. The message transmitter of claim 41 wherein the input means comprises a writing tablet.

44. A portable message transmitter for use in selecting a destination device from a plurality of destination devices, said selected device capable of receiving synthesized waveforms over a switched network, said portable hand held message transmitter comprising:

input means for receiving alphanumeric characters and commands from a user and for generating signals indicative thereof;

display means for displaying characters indicative of signals provided thereto;

destination selection means responsive to signals generated by the input means for selecting the destination device from among a plurality of destination devices, for establishing a transmission path in the switched network, and for determining a data type for the selected destination, said data type being one of at least two predetermined data types;

message holding means responsive to signals generated by the input means for holding words of binary data indicative of a message from the user, each word associated with a particular character in the message;

waveform synthesis means responsive to the data type being a first one of the at least two predetermined data types, said waveform synthesis means responsive to the destination selection means for deriving pixel-map data indicative of rows of the perceived shape of the characters associated with the words of binary data, for producing bit streams indicative of the pixel-map data, and for synthesizing differential phase-shift key waveforms corresponding to the bit streams by controlling a differential phase-shift key waveform generator, said differential phase-shift key waveform generator comprising sinusoidal generation means responsive to a predetermined command generated by the input means for scanning a table having a predetermined number of equally spaced apart entries corresponding to different amplitudes values of a sinusoidal wave with an index pointer, the amplitude of the established signal selected resulting from the scanning of different table entries by the index pointer, thereby generating a sinusoidal carrier frequency, phase shift means responsive to the contents of the bit stream for changing the index pointer sufficiently to change the phase of the sinusoidal signal delivered to the selected destination; and coupling means for coupling said synthesized waveforms to a transmission line, whereby the waveforms may be received a first device type from said plurality of destination devices capable of recognizing said differential phase-shift key waveforms;

said waveform synthesis means further responsive to the said data type being a second one of the at least two predetermined data types, for queuing the words of binary data, for generating a serial bit stream of the words of binary data, and for synthesizing frequency-shift keyed signals indicative of the bit stream; and coupling means for coupling said synthesized waveforms to a transmission line.

45. A message receiver for receiving alphanumeric characters from message transmitter over a communication channel, said message transmitter providing analog output signals representing nibbles of a binary representation of characters in an alphanumeric message, said message receiver comprising:

input means responsive to reception of analog signals from the message transmitter for receiving the analog signals over the communication channel and for converting the analog signals to binary bit nibbles;

queuing means responsive to reception of the binary bit nibbles for queuing the binary bit nibbles as a serial binary bit stream and for converting the serial binary bit stream to binary coded row numbers, each of the binary coded row numbers comprising a predetermined number of bits from said serial binary bit stream;

lookup means having an initial case state and an initial group state with respect to a lookup table having a plurality of rows associated with binary-coded row numbers and two column-pairs associated with a plurality of respective groups, each column-pair comprising two columns each associated with one case of an upper case and a lower case, wherein the intersections of ones of the plurality of rows and ones to the two columns are associated with ones of character signals in a preselected case of a preselected group, said lookup means responsive to the receipt of a binary coded row number for selecting the intersection of the row associated with the binary coded row number and said preselected case of said preselected group, said preselected case of said preselected group initially corresponding to the initial case state and initial group state, said lookup means further responsive to the receipt of a change-case signal from the selected intersection for changing the preselected case for subsequent selection of intersections, said lookup means further responsive to receipt of a change-group signal from the selected intersection for changing the preselected group for subsequent selection of intersections; and character output means responsive to the receipt a character signal from the intersection of selected rows and columns in the lookup means for converting said character signals to user accessible representations.

46. The message receiver of claim 45 wherein the communication channel is a switched network and the message receiver is a message receiving host.

47. The message receiver of claim 45 wherein the communication channel is a radio frequency broadcast system and the message receiver is a portable battery powered device.

48. The message receiver of claim 45 wherein the binary coded row number comprises 5 bits.

49. The message receiver of claim 45 wherein the binary coded row number comprises 6 bits.

50. The message receiver of claim 45 wherein the binary coded row numbers may be one of at least two predetermined bit lengths and wherein said input means further comprises a binary row bit length decoding means responsive to the reception of said binary bit nibbles for determining the binary bit length of the binary coded row numbers.

51. The message receiver of claim 45 further characterized in that each of the binary bit nibbles is provided by the message transmitter as a respective analog dual-tone multifrequency tone, and wherein the message receiver converts each of said respective analog dual-tone multifrequency tones to the respective binary bit nibble.

52. The message receiver of claim 45 further characterizes in that each of the binary bit nibbles is provided by the message transmitter as a serial sequence of a plurality of analog signals each representative of a corresponding bit of the binary bit nibble, and wherein the message receiver converts each such analog dual-tone to the respective binary bit nibble.

53. The message receiver of claim 45 wherein the binary-coded row numbers comprises 4 bits.

54. A message receiver for receiving alphanumeric characters from message transmitter over a communication channel, said message transmitter providing analog output signals representing nibbles of a binary representation of characters in an alphanumeric message, said message receiver comprising:

input means responsive to reception of analog signals from the message transmitter for receiving the analog signals over the communication channel and for converting the analog signals to binary bit nibbles;

queuing means responsive to reception of the binary bit nibbles for queuing the binary bit nibbles as a serial binary bit stream;

lookup means with respect to a plurality of lookup tables having binary bit representations for respective selected character signals, wherein the binary bit representation in at least one of said plurality of lookup tables provides relatively shorter unique binary bit representation for frequently used characters and relatively longer binary bit representations for less frequently used characters, the binary bit representation being no shorter than a predetermined shortest length and no longer than a predetermined greatest length, said lookup means comprising means to receive binary bit nibbles from the queuing means for selecting one of the plurality of lookup tables for evaluating a series of binary bit data and for receiving a sequence of binary bit nibbles of a length corresponding to the shortest unique binary bit representation within the selected one of the plurality of lookup tables, said lookup means further comprising first means for determining whether the sequence of bits matches that of one of the binary bit representation of a length equal to that of the sequence of bits within the selected lookup table, and for generating the character signal corresponding to the matching bit representation, said lookup means further comprising second means responsive to the absence of a match and the selection of one of the plurality of lookup tables which provides for relatively shorter unique binary bit representation for frequently used characters and relatively longer binary bit representation for less frequently used characters for receiving from the queuing means and for appending at least one additional bit to the sequence of bits, said sequence of bits being provided to the first means; and character output means responsive to the receipt of a character signal from the lookup mans for converting said character signals to user accessible representations.

55. The message receiver of claim 54 wherein the communication channel is a switched network and the message receiver is a message receiving host.

56. The message receiver of claim 54 wherein the communication channel is a radio frequency broadcast system and the message receiver is a portable battery powered device.

57. The message receiver of claim 54 further characterized in that each of the binary bit nibbles is provided by the message transmitter as a respective analog dual-tone multifrequency tone, and wherein the message receiver converts each such analog dual-tone multifrequency tone to the respective binary bit nibble.

58. The message receiver of claim 54 further characterizes in that each of the binary bit nibbles is provided by the message transmitter as a serial sequence of a plurality of analog signals each representative of a corresponding bit of the binary bit nibble, and wherein the message receiving host converts each such analog dual-tone to the respective binary bit nibble.

* * * * *

UNITED STATES PATENT AND TRADEMARK OFFICE
CERTIFICATE OF CORRECTION

PATENT NO. : 5,249,220
DATED : September 28, 1993
INVENTOR(S) : Moskowitz et al.

It is certified that error appears in the above-identified patent and that said Letters Patent is hereby corrected as shown below:

Column 13, line 15, "encoding 10" should read --encoding--.

Column 15, line 44,, "Which" should read --which--.

Column 24, line 31, "from" should read --from a--.

Column 26, line 36, "mans" should read --means--.

Column 1, line 63, "character" should read --characters--.

Column 6, line 50, "also" should read --also be--.

Column 8, line 48, "above jack" should read --telephone jack--.

Column 11, line 43, "ship" should read --skip--.

Column 14, line 22, "then" should read --than--.

Column 15, line 5, "a" should read --an--.

Column 15, line 35, "to representing" should read --representing--.

Column 16, lines 44-45, "more information" should read --more information is needed--.

Column 18, line 59, "amplitudes" should read --amplitude--.

Column 21, line 41, "wherein" should read --wherein the--.

Column 22, line 53, "are" should read --being--.

Column 24, line 5, "amplitudes" should read --amplitude--;

UNITED STATES PATENT AND TRADEMARK OFFICE
CERTIFICATE OF CORRECTION

PATENT NO. : 5,249,220
DATED : September 28, 1993
INVENTOR(S) : Moskowitz et al.

It is certified that error appears in the above-identified patent and that said Letters Patent is hereby corrected as shown below:

Column 24, line 17, "received" should read --received by--.

Column 25, line 5, "receipt" should read --receipt of--.

Column 25, lines 35-36, "characterizes" should read --characterized--.

Column 25, line 43, "comprises" should read --comprise--.

Column 26, line 20, "representation" should read --representations--.

Column 26, line 52-53, "characterizes" should read --characterized--.

Signed and Sealed this

Twenty-third Day of August, 1994

Attest:

BRUCE LEHMAN

Attesting Officer

Commissioner of Patents and Trademarks